US012628384B2

(12) United States Patent
Feng et al.

(10) Patent No.: US 12,628,384 B2
(45) Date of Patent: May 12, 2026

(54) ENHANCED-SHAPED EXTENSION REGION(S) FOR GATE-ALL-AROUND (GAA) FIELD EFFECT TRANSISTOR (FET) DEVICE, AND RELATED FABRICATION METHODS

(71) Applicant: QUALCOMM Incorporated, San Diego, CA (US)

(72) Inventors: Peijie Feng, San Diego, CA (US); Yan Sun, San Diego, CA (US); Shreesh Narasimha, Charlotte, NC (US)

(73) Assignee: QUALCOMM Incorporated, San Diego, CA (US)

( * ) Notice: Subject to any disclaimer, the term of this patent is extended or adjusted under 35 U.S.C. 154(b) by 425 days.

(21) Appl. No.: 18/313,060

(22) Filed: May 5, 2023

(65) Prior Publication Data

US 2024/0371924 A1     Nov. 7, 2024

(51) Int. Cl.
H01L 29/06 (2006.01)
H01L 21/8234 (2006.01)
(Continued)

(52) U.S. Cl.
CPC ......... H10D 62/102 (2025.01); H10D 30/014 (2025.01); H10D 30/43 (2025.01);
(Continued)

(58) Field of Classification Search
CPC .... H10D 30/014; H10D 30/024; H10D 30/43; H10D 30/62; H10D 30/6211;
(Continued)

(56) References Cited

U.S. PATENT DOCUMENTS 10,516,064 B1 * 12/2019 Cheng .................... H10D 84/83
10,903,317 B1 * 1/2021 Frougier .............. H10D 30/014
(Continued)

OTHER PUBLICATIONS

International Search Report and Written Opinion for International Patent Application No. PCT/US2024/024572, mailed Jul. 24, 2024, 18 pages.

*Primary Examiner* — David C Spalla
(74) *Attorney, Agent, or Firm* — Withrow & Terranova, PLLC

(57) ABSTRACT

Enhanced-shaped extension region for gate-all-around (GAA) field-effect transistor (FET) devices and related fabrication methods are disclosed. The GAA FET device includes an extension region of semiconductor material coupled from the respective channel to the source/drain region to facilitate forming a conductive channel between the source and the drain regions when the GAA FET device is activated. The area of the extension region between the source/drain regions and the channel forms a series resistance between source/drain regions and the channel. To reduce channel parasitic resistance, the extension region of the GAA FET device has an enhanced extension portion that has an extended height orthogonal to the channel direction. The extension region with its enhanced extension portion has reduced resistance as compared to an extension region not containing the enhanced extension portion, thus reducing channel parasitic resistance of the GAA FET device for improved performance.

26 Claims, 15 Drawing Sheets

(51) Int. Cl.

| | |
|---|---|
| *H01L 27/088* | (2006.01) |
| *H01L 29/08* | (2006.01) |
| *H01L 29/417* | (2006.01) |
| *H01L 29/423* | (2006.01) |
| *H01L 29/66* | (2006.01) |
| *H01L 29/775* | (2006.01) |
| *H01L 29/786* | (2006.01) |
| *H10D 30/01* | (2025.01) |
| *H10D 30/43* | (2025.01) |
| *H10D 30/67* | (2025.01) |
| *H10D 62/10* | (2025.01) |
| *H10D 62/13* | (2025.01) |
| *H10D 64/01* | (2025.01) |
| *H10D 64/23* | (2025.01) |
| *H10D 84/01* | (2025.01) |
| *H10D 84/03* | (2025.01) |
| *H10D 84/83* | (2025.01) |

(52) U.S. Cl.
CPC ..... *H10D 30/6729* (2025.01); *H10D 30/6735* (2025.01); *H10D 30/6757* (2025.01); *H10D 62/121* (2025.01); *H10D 62/151* (2025.01); *H10D 64/018* (2025.01); *H10D 64/021* (2025.01); *H10D 64/258* (2025.01); *H10D 84/0128* (2025.01); *H10D 84/013* (2025.01); *H10D 84/0147* (2025.01); *H10D 84/038* (2025.01); *H10D 84/83* (2025.01)

(58) Field of Classification Search
CPC ........... H10D 30/6212; H10D 30/6213; H10D 30/6219; H10D 30/6713; H10D 30/6729; H10D 30/6735; H10D 30/6757; H10D 30/797; H10D 62/021; H10D 62/102; H10D 62/118; H10D 62/119; H10D 62/121; H10D 62/149; H10D 62/151; H10D 64/015; H10D 64/018; H10D 64/021; H10D 64/258; H10D 84/0128; H10D 84/013; H10D 84/0147; H10D 84/0158; H10D 84/017; H10D 84/0193; H10D 84/038; H10D 84/83; H10D 84/834; H10D 84/853
See application file for complete search history.

(56) References Cited

U.S. PATENT DOCUMENTS

| | | |
|---|---|---|
| 2019/0288121 A1 | 9/2019 | Lee et al. |
| 2020/0185539 A1* | 6/2020 | Lee .................... H10D 30/6735 |
| 2021/0043727 A1 | 2/2021 | Frougier et al. |
| 2021/0134952 A1 | 5/2021 | Fung |
| 2021/0367032 A1 | 11/2021 | Chen et al. |

* cited by examiner

600

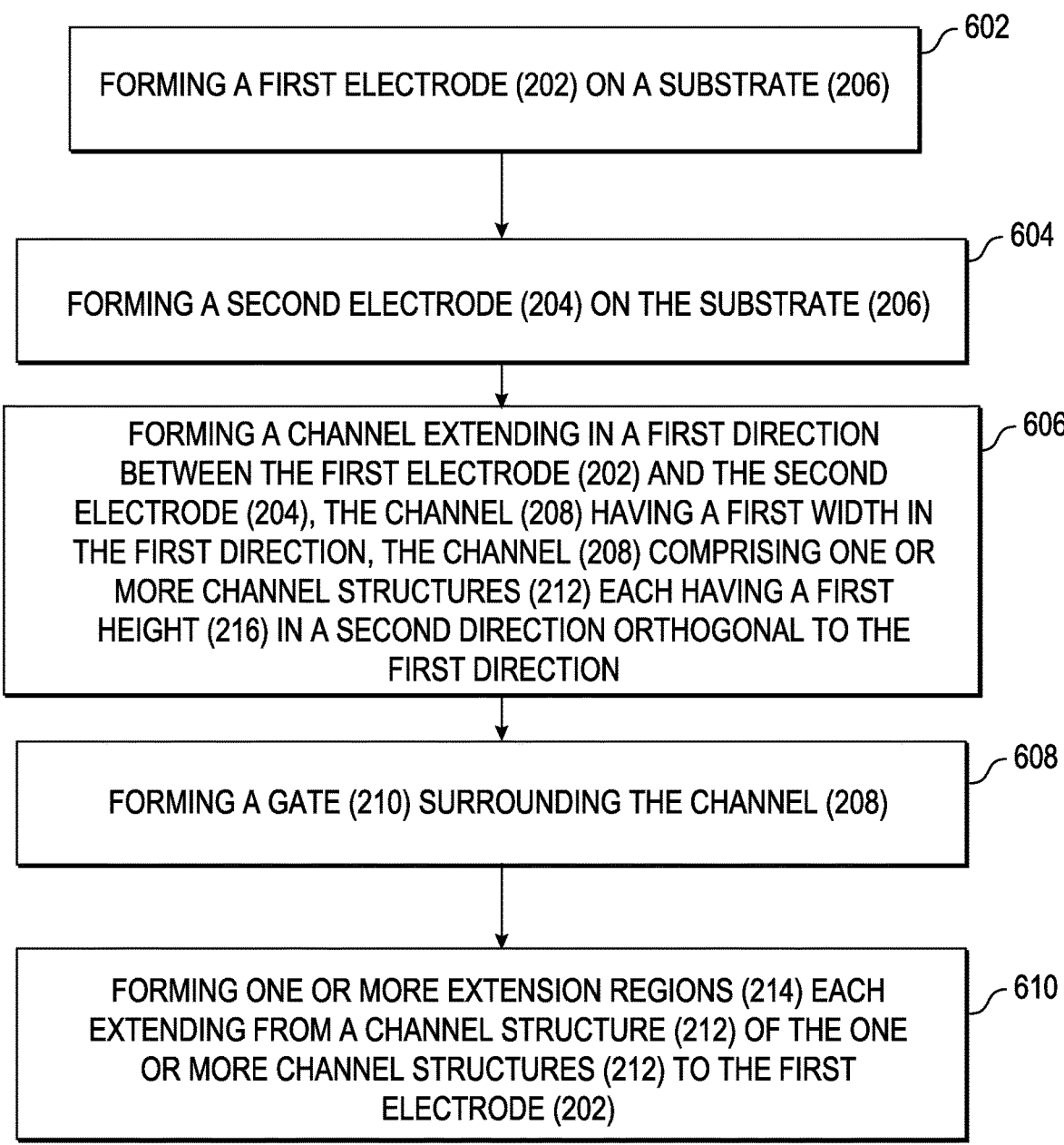

FORMING A FIRST ELECTRODE (202) ON A SUBSTRATE (206) ⌐602

FORMING A SECOND ELECTRODE (204) ON THE SUBSTRATE (206) ⌐604

FORMING A CHANNEL EXTENDING IN A FIRST DIRECTION BETWEEN THE FIRST ELECTRODE (202) AND THE SECOND ELECTRODE (204), THE CHANNEL (208) HAVING A FIRST WIDTH IN THE FIRST DIRECTION, THE CHANNEL (208) COMPRISING ONE OR MORE CHANNEL STRUCTURES (212) EACH HAVING A FIRST HEIGHT (216) IN A SECOND DIRECTION ORTHOGONAL TO THE FIRST DIRECTION ⌐606

FORMING A GATE (210) SURROUNDING THE CHANNEL (208) ⌐608

FORMING ONE OR MORE EXTENSION REGIONS (214) EACH EXTENDING FROM A CHANNEL STRUCTURE (212) OF THE ONE OR MORE CHANNEL STRUCTURES (212) TO THE FIRST ELECTRODE (202) ⌐610

FROM FIG. 7A

FORM CHANNEL STRUCTURES
212(1)-212(3)

TO FIG. 7C

ENHANCED-SHAPED EXTENSION REGION(S) FOR GATE-ALL-AROUND (GAA) FIELD EFFECT TRANSISTOR (FET) DEVICE, AND RELATED FABRICATION METHODS

BACKGROUND

I. Field of the Disclosure

The technology of the disclosure relates generally to field-effect transistors (FET), and more particularly to gate-all-around (GAA) FET.

II. Background

Transistors are essential components in modern electronic devices. Large numbers of transistors are employed in integrated circuits (ICs) in many modern electronic devices. For example, components such as central processing units (CPUs) and memory systems each employ a large quantity of transistors for logic circuits and memory devices. As electronic devices become more complex in functionality, so does the need to include a greater number of transistors in such devices. However, these electronic devices are also required to have ever greater performance and efficiency.

This increase in the number of transistors is achieved in part through continued efforts to miniaturize transistors in ICs (i.e., placing increasingly more transistors into the same amount of space). As a result, gate lengths are also reduced in a scalable fashion, thereby reducing channel length of the transistors. For example, as the channel length in planar transistors is reduced such that the channel length is of the same order of magnitude as depletion layer widths, short channel effects (SCEs) can occur that degrade performance. More specifically. SCEs in planar transistors cause increased current leakage, reduced threshold voltage, and/or threshold voltage roll-off (i.e., reduced threshold voltage at shorter gate lengths), and therefore, reduced gate control.

In this regard, alternative FET designs to planar FETs have been developed. These alternative transistor designs provide for a gate material to wrap around at least a portion of a channel structure to provide better gate control over an active channel therein. Better gate control provides reduced current leakage and increased threshold voltage compared to a planar FET of a similar footprint. One example of a gate around FET is a FinFET. A FinFET provides a channel structure formed by a thin semiconductor material "fin" disposed above the substrate between a source and a drain. The FinFET also includes a "wrap-around" gate that wraps around top and side portions of the fin to provide gate control of the channel formed by the channel structure. However, it has become difficult to scale down of the size of FinFETs due to fabrication and performance limitations. In this regard, gate-all-around (GAA) FETs have been further developed. A GAA FET includes one or more nano channel structures of semiconductor material (e.g., nanowires or nanosheets) that are stacked in relationship to each other and disposed between a source and a drain. Each nano channel structure forms part of the channel of the GAA FET. To provide better gate control of the channel, a gate material is disposed all around each of the channel structures as well as between adjacent channel structures. This provides an even greater gate area in the GAA FET to provide reduced current leakage and increased threshold voltage as compared to a planar FET and/or FinFET.

SUMMARY OF THE DISCLOSURE

Aspects of the present disclosure include an enhanced-shaped extension region for gate-all-around (GAA) field-effect transistor (FET) devices. Related fabrication methods are also disclosed. The GAA FET device includes first and second electrodes disposed on a substrate that provide an electrical path and comprise source/drain regions. The GAA FET device also includes a channel disposed between the first and second electrodes (source or drain). The channel includes one or more channel structure(s) in a stacked arrangement and a gate surrounding the channel structure(s). The channel structure(s) extends in a first direction between the first and second electrodes. The GAA FET device also includes an extension region of semiconductor material coupled from the respective channel to the first and second electrodes to facilitate forming a conductive channel between the source and the drain regions when the GAA FET device is activated. Thus, the area of the extension region between the first and second electrodes and the channel of the GAA FET device forms a series resistance path between the first and second electrodes and the channel. To reduce the parasitic resistance of the channel, the extension region of the GAA FET device has an enhanced extension portion that has an extended height orthogonal to the channel direction. In this manner, the extension region with its enhanced extension portion has a reduced resistance as compared to an extension region not containing the enhanced extension portion, thus reducing the parasitic resistance of the GAA FET device for improved device performance. For example, the increased size of the extension region reduces resistivity by providing a broader carrier pathway between the source and drain regions and the channel of the GAA FET.

In another exemplary aspect, the enhanced extension portions of the extension region of the GAA FET device result from gate spacers adjacent to the extension region in the GAA FET device being fabricated to have a reduced height. This reduces the area of the spacers between the gate and the extension regions, which in turn reduces gate parasitic capacitance of the GAA FET device for improved performance. The gate parasitic capacitance is reduced, because the surface area of the dielectric material in the space between the gate and the extension regions is reduced. Reducing the surface area of the dielectric material between conductive materials reduces the capacitance between such conductive materials. Additional strain may also be imparted by the source and drain regions to the channel of the GAA FET with reduced area gate spacers. Increasing strain on the channel of the GAA FET can increase its carrier mobility. This is because the gate spacer has the effect of interrupting the strain effect that the source and drain regions (e.g., epitaxially grown source and drain regions) may otherwise impart on the channel because of the lattice mismatch between the spacer material of the gate spacers and the gate. For example, compressive channel strain can increase carrier mobility of a P-type semiconductor material (P) PFET. Tensile channel strain can increase carrier mobility of an N-type semiconductor material (N) NFET.

In another exemplary aspect, a method for fabricating the GAA FET with enhanced extension regions(s) with an extended height orthogonal to the channel direction to reduce parasitic resistance and/or reduce parasitic capacitance is provided. In one example, to provide for enhanced extension regions(s) to have an extended height, the process involves providing semiconductor material layers and removing sacrificial layers to form the extension regions and channel structures for the GAA FET. An additional etch (e.g., an isotropic etch) is performed after the channel of the GAA FET is formed and before the gate material is disposed. For example, an additional etch may be performed to increase the height of the recess adjacent to channel structures of the GAA FET that were formed from part of the original semiconductor material layer and an increased height for enhanced extension regions remains as residual structures in the GAA FET. In addition, this additional etch leaves a decreased height for formation of the inner spacer adjacent to the gate material.

In this manner, after the semiconductor material layers (e.g., Si layers) are processed to fabricate the GAA FET, the resulting extension layers formed therefrom will have enhanced extension portions of a greater height than that of the channel structures. In another example, interleaved sacrificial layers (e.g., SiGe layers) of a reduced height can also be formed before being processed to fabricate the GAA FET so that the inner spacers formed adjacent to the etched side walls of the sacrificial layers will be a reduced height when formed. These reduced height inner spacers are consumed by the increased height portion of the semiconductor material layers that form the extension region so that the extension region has enhanced extension portions of increased height. In another example, the thickness of the sacrificial layers is reduced by the same height that the semiconductor material layers are increased by, so that the reduction in thickness of the sacrificial layers offsets the increase in thickness of the semiconductor material layers. This allows formation of a channel of the GAA FET with the same overall channel height and gaps between channel structure(s) while still providing for the enhanced extension regions.

In this regard in one aspect, a gate-all-around (GAA) field effect transistor (FET) device comprises a first electrode on a substrate and a second electrode on the substrate. The GAA FET further comprises a channel extending in a first direction between the first electrode and the second electrode, the channel having a first width in the first direction. The channel comprises one or more channel structures each having a first height in a second direction orthogonal to the first direction. The GAA FET further comprises a gate surrounds the channel. The GAA FET further comprises one or more first extension regions each extending from a channel structure of the one or more channel structures to the first electrode. The one or more first extension regions each comprise one or more first enhanced extension portions, each having a second height in the second direction greater than the first height.

In this regard in another aspect, a method of fabricating a GAA FET device is provided. The method comprises forming a first electrode on a substrate and forming a second electrode on the substrate. The method further comprises forming a channel extending in a first direction between the first electrode and the second electrode, the channel having a first width in the first direction and comprising one or more channel structures each having a first height in a second direction orthogonal to the first direction. The method further comprises forming a gate surrounding the channel and forming one or more extension regions each extending from a channel structure of the one or more channel structures to the first electrode. The one or more first extension regions each comprise one or more first enhanced extension portions, each having a second height in the second direction greater than the first height.

BRIEF DESCRIPTION OF THE FIGURES

FIG. 6 is a flowchart illustrating an exemplary fabrication process for fabricating a GAA FET device having an enhanced extension region between the electrodes providing source/drain regions and the channel, wherein the enhanced extension region has an enhanced extension portion of reduced resistance to reduce channel parasitic resistance and/or reduce gate parasitic capacitance, including but not limited to the GAA FET devices in FIGS. 2-5;

DETAILED DESCRIPTION

Figures 1A, 1B:
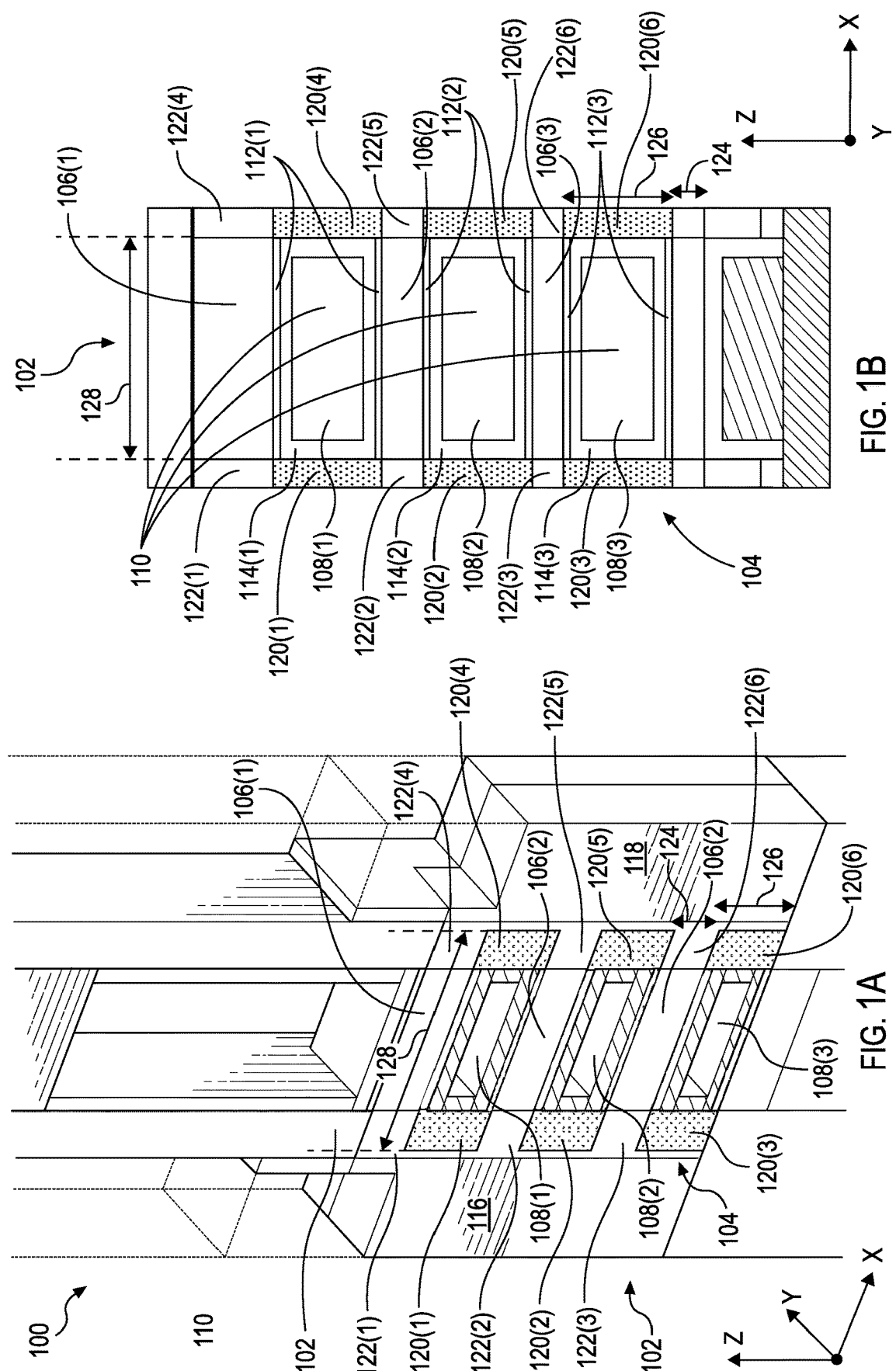
FIGS. 1A and 1B illustrate a perspective and side view of a portion of a conventional gate-all-around (GAA) field effect transistor (FET) device.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects of the present disclosure include an enhanced-shaped extension region between channel structures and the electrodes for gate-all-around (GAA) field-effect transistor (FET) devices. Related fabrication methods are also disclosed. The GAA FET device includes electrodes made of semiconductor material to provide source and drain regions disposed on a substrate. The GAA FET device also includes a channel disposed between the source electrode and the drain electrode. The channel includes one or more channel structures in a stacked arrangement and a gate surrounding the channel structure(s). The channel structure(s) extends in a first direction between the source and drain electrodes. The GAA FET device also includes an extension region of semiconductor material coupled from the respective channel to the source electrode and drain electrode to facilitate forming a conductive channel between the source and the drain regions within the electrodes when the GAA FET device is activated. Thus, the area of the extension region between the source/drain electrodes and the channel of the GAA FET device forms a series resistance path between the source and drain electrodes and the channel. To reduce the parasitic resistance of the channel, the extension region of the GAA FET device has an enhanced extension portion that has an extended height orthogonal to the channel direction greater than the height of the channel structure(s). In this manner, the extension region with its enhanced extension portion has a reduced resistance as compared to an extension region not containing the enhanced extension portion, thus reducing the parasitic resistance of the GAA FET device for improved device performance. For example, the increased size of the extension region reduces resistivity by providing a broader carrier pathway between the source and drain regions and the channel structure(s) of the GAA FET.

Examples of GAA FET device(s) having an enhanced extension region between the electrodes providing source/drain regions and the channel, wherein the enhanced extension region has an enhanced extension portion of reduced resistance to reduce channel parasitic resistance and/or reduce gate parasitic capacitance, are discussed below starting at FIG. 2. However, before discussing such examples, FIGS. 1A and 1B illustrating a conventional GAA FET device are first described below.

In this regard, FIGS. 1A and 1B illustrate a perspective and a side view, respectively, of a portion of a conventional GAA FET device 100. Specifically, FIG. 1A shows a perspective view of a cross-section across a channel body 102 comprising a channel 104 for the GAA FET device 100. FIG. 1B shows a side view of the GAA FET device 100. As shown in FIGS. 1A and 1B, the conventional GAA FET device 100 includes the channel body 102 for the channel 104 that includes a plurality of channel structures 106(1)-106(3). The channel structures 106(1)-106(3) collectively form the channel 104 and channel body 102 between a source region 116 and drain region 118. In this example, the channel structures 106(1)-106(3) are shaped as nanoslabs that are elongated in the horizontal (X-axis) direction.

With reference to FIG. 1B, a gate 110 comprising gate structures 108(1)-108(3) in the form of a metal material that surrounds the channel structures 106(1)-106(3) for the GAA FET device 100 is shown. As shown, the gate structures 108(1)-108(3) are also shaped as nanoslabs elongated in the horizontal (Y-axis) direction. An interfacial layer 112(1)-112(3) is disposed around the gate structures 108(1)-108(3) and a high-K dielectric material layer 114(1)-114(3) to insulate the gate 110 from the channel structures 106(1)-106(3). Typically, during fabrication, the high-K dielectric material layer 114(1)-114(3) is deposited first isotropically, and then the interfacial layer 112(1)-112(3) is deposited. In addition, inner spacers 120(1)-120(6) are provided to insulate the gate 110 from the source region 116 and drain region 118 and define a width 128 of the channel 104 within the channel body 102. The inner spacers 120(1)-120(6) are formed during fabrication of the GAA FET device 100 with a height 126 and width 128 to control the distance between the gate 110 and the source region 116 and drain regions 118 and to prevent short circuiting between the gate 110 and the source region 116 and drain region 118. The inner spacers 120(1)-120(6) are formed based on fabrication limitations to allow the gate 110 to be disposed completely around and between the channel structures 106(1)-106(3) so that the gate 110 can provide sufficient gate control of the channel 104 formed by the channel structures 106(1)-106(3). In this manner, applying a voltage to the gate 110 and gate structures 108(1)-108(3) controls an electric field in the channel structures 106(1)-106(3) to cause current to flow through the channel structures 106(1)-106(3) during an active mode.

As shown in FIG. 1B, the height (in the Z-axis direction) of the channel structures 106(1)-106(3) are each of a height 124, and the channel structures 106(1)-106(3) are thus separated by the height 126, which corresponds to the height of the gate structures 108(1)-108(3) within the channel body 102. For example, the height 124 may be fourteen (14) nanometers (nm). The height 126 may be configured as a result of fabrication limitations on the minimum space needed between adjacent channel structures 106(1)-106(3) and the gate structures 108(1)-108(3) for the gate 110.

Figure 1C:
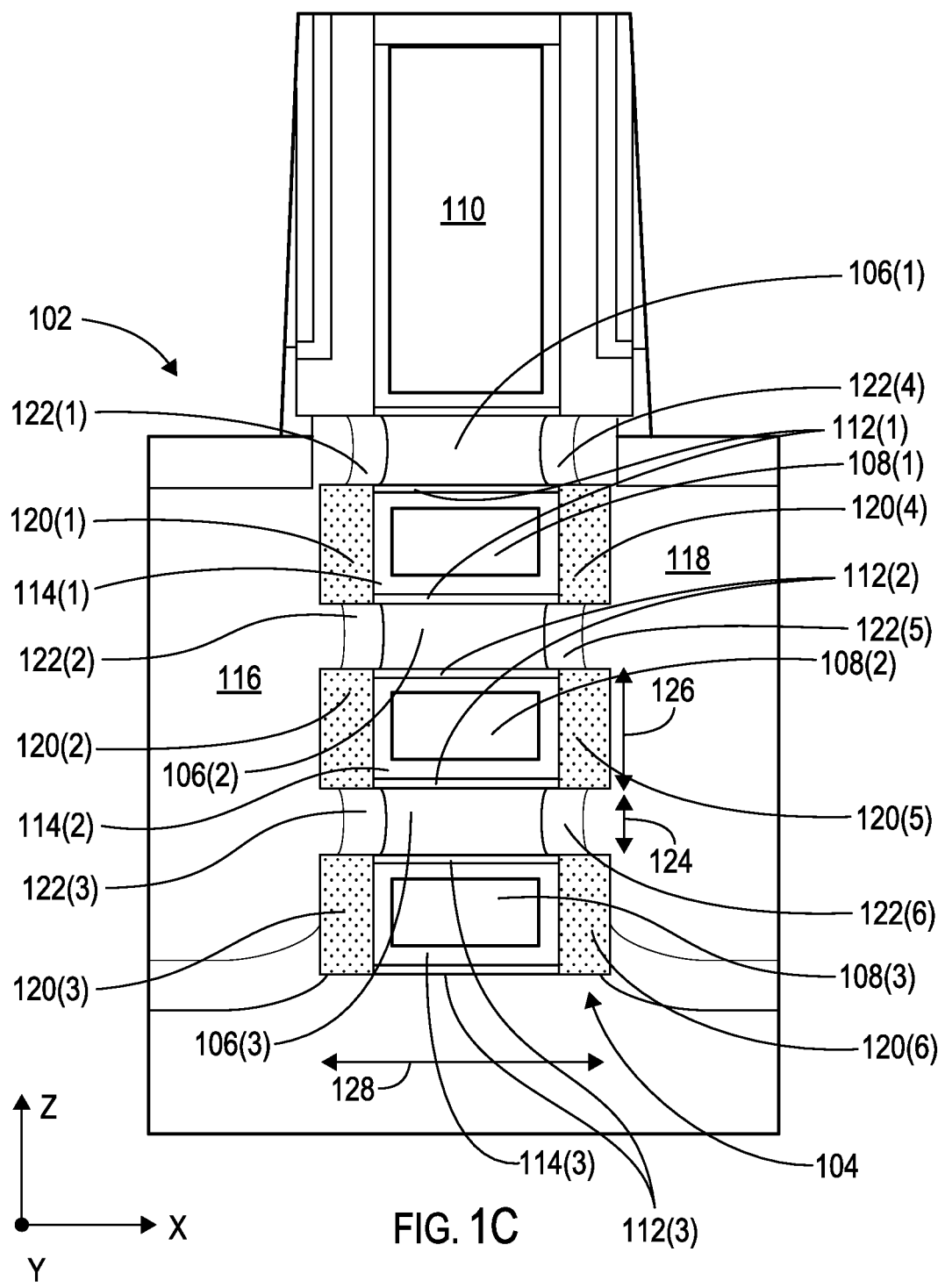
FIG. 1C illustrates a cross-sectional view across the channel of the conventional GAA FET device shown in FIGS. 1A and 1B.

FIG. 1C illustrates a cross-sectional view across the channel body 102 and the channel 104 of the conventional GAA FET device 100 shown in FIGS. 1A and 1B. As shown, in this cross-sectional view, the channel body 102 and the channel 104 are disposed between the source region 116 and the drain region 118. The channel 104 has a width 128 in a horizontal (X-axis) direction.

Extension regions 122(1)-122(6) extend (in the X-axis direction) from the channel structures 106(1)-106(3) towards the source and drain regions 116, 118, respectively. The extension regions 122(1)-122(6) are doped regions adjacent to the source and drain regions 116, 118 to reduce the electric field at the source and drain regions 116, 118 when the GAA FET device 100 is activated. The extension regions 122(1)-122(6) form part of a conductive path between the source and drain regions 116, 118 and the channel 104. Thus, the extension regions 122(1)-122(6) are part of a series resistance path between the channel 104 and the source and drain regions 116, 118. It may be desirable to have a lower resistance to improve the performance of a GAA FET device 100.

As noted, gate structures 108(1)-108(3) have inner spacers 120(1)-120(6) adjacent on either side of the gate 110 that define the width 128 of the channel 104 and provide isolation for the gate 110. Correspondingly, the inner spacers 120(1)-120(6) are complementary in size to the extension regions 122(1)-122(6) according to the heights 124, 126. For example, as shown in FIG. 1C, the height 124 of the extension regions 122(1)-122(6) are the same height as the channel structures 106(1)-106(3) as a result of the fabrication process and its constraints. However, GAA devices suffer short channel effects (SCE), series resistance, and parasitic capacitance depending on the height of the channel structures 106(1)-106(3), which is dependent upon the heights 124, 126 of the inner spacers 120(1)-120(6). Accordingly, the sizing of the inner spacers 120(1)-120(6) and the extension regions 122(1)-122(6) affect the SCE, series resistance, and parasitic capacitance suffered by a GAA FET device 100. It may thus be desired to provide a GAA FET design that improves the parasitic resistance and parasitic capacitance.

In this regard, aspects of the present disclosure include an enhanced-shaped extension region for GAA FET devices. The GAA FET device includes an enhanced extension region of semiconductor material coupled from the respective channel to the first and second electrodes to facilitate forming a conductive channel between the electrodes when the GAA FET device is activated. The first and second electrodes provide an electrical path and are made of a semiconductor material that provide source/drain regions for the GAA FET device. The area of the enhanced extension region between the first and second electrodes and the channel of the GAA FET device forms a series resistance path between the first and second electrodes and the channel. To reduce the parasitic resistance of the channel, the extension region of the GAA FET device has an enhanced extension portion that has an extended height orthogonal to the channel direction. In this manner, the extension region with its enhanced extension portion has a reduced resistance as compared to an extension region not containing the enhanced extension portion, thus reducing the parasitic resistance of the GAA FET device for improved device performance. For example, the increased size of the extension region reduces resistivity by providing a broader electrical pathway for carriers moving between the source and drain regions and the channel of the GAA FET.

Figure 2:
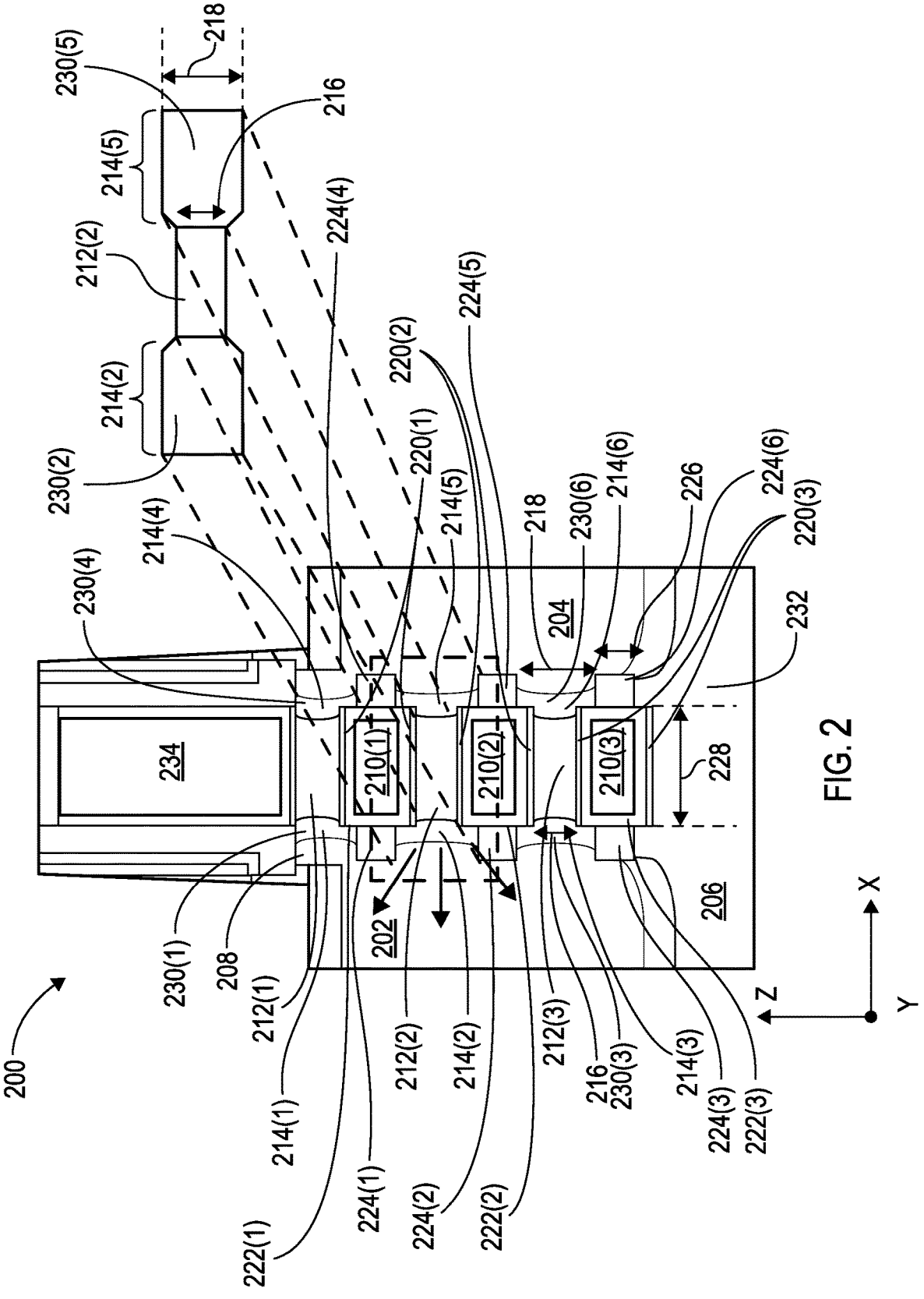
FIG. 2 is a cross-sectional view across a channel of an exemplary GAA FET device having an enhanced extension region between the electrodes providing source/drain regions and the channel, wherein the enhanced extension region has an enhanced extension portion of reduced resistance to reduce channel parasitic resistance and/or reduce gate parasitic capacitance.

In this regard, FIG. 2 is shown to illustrate a cross-sectional side view of an exemplary GAA FET device 200 that has a reduced parasitic resistance and/or capacitance by employing enhanced extension regions 214(1)-214(6) having end portions that are enhanced extension portions 230(1)-230(6). For example, the GAA FET device 200 includes a source electrode 202 that provides electrical contact and serves as a source region and a drain electrode 204 that provides electrical contact and serves as a drain region. Both the source electrode 202 and the drain electrode 204 are disposed on a substrate 206. The GAA FET device 200 also includes a channel 208 having a channel body 232 with a width 228. The channel body 232 is disposed between the source electrode 202 and the drain electrode 204, wherein the channel 208 is surrounded by a gate 234 comprising gate structures 210(1)-210(3). As shown, within the channel 208, a plurality of channel structures 212(1)-212(3) are surrounded by the gate structures 210(1)-210(3). During operation, applying a voltage to the gate 234 and gate structures 210(1)-210(3) controls an electric field in the channel structures 212(1)-212(3) to cause current to flow through the channel structures 212(1)-212(3) between the source electrode 202 and the drain electrode 204 during an active mode.

As discussed in more detail below, adjacent on either side of the channel structures 212(1)-212(3) are enhanced extension regions 214(1)-214(6) that extend from the channel structures 212(1)-212(3) towards the source electrode 202 and the drain electrode 204. The enhanced extension regions 214(1)-214(6) have end portions that are enhanced extension portions 230(1)-230(6) respectively that are an extended height 218 in a first direction (Z-axis direction) that is greater than a height 216 of the channel structures 212(1)-212(3), and orthogonal to the channel direction of a channel 208 in a second direction (X-axis direction). In this manner, the enhanced extension regions 214(1)-214(6) with their enhanced extension portions 230(1)-230(6) have a reduced resistance as compared to an extension region not containing the enhanced extension portions 230(1)-230(6), such as the GAA FET device 100 in FIGS. 1A and 1B. Reducing the parasitic resistance of the GAA FET device 200 improves its performance. For example, the increased size of the enhanced extension portions 230(1)-230(6) of the enhanced extension regions 214(1)-214(6) reduces resistivity by providing a broader carrier pathway between the source and drain electrodes 202, 204 and the channel structures 212(1)-212(3) of the GAA FET device 200.

As noted, the GAA FET device 200 comprises a channel body 232 comprising a stacked arrangement of channel structures 212(1)-212(3) and may be made of a semiconductor material disposed on the substrate 206. In this example, the channel structures 212(1)-212(3) are shaped as nanoslabs that are elongated in the horizontal (Y-axis) direction. A nanoslab is thin slice of semiconductor material (e.g., Si) that has a thickness typically in a nanometer (nm) range. Note that the channel structures 212(1)-212(3) could also be other types of nano structures, including but not limited to nanosheets and nanowires. As shown, the gate structures 210(1)-210(3) in the form of a metal material surround the channel structures 212(1)-212(3) to form the gate 234 of the GAA FET device 200. An interfacial layer 220(1)-220(3) is disposed around the respective gate structures 210(1)-210(3) and a high-K dielectric material layer 222(1)-222(3) to insulate the gate structures 210(1)-210(3) from the channel structures 212(1)-210(3). In this manner, applying a voltage to the gate structures 210(1)-210(3) controls an electric field in the channel structures 212(1)-212(3) to cause current to flow through the channel structures 212(1)-212(3) and enhanced extension regions 214(1)-214(6) during an active mode between the source electrode 202 and the drain electrode 204. On both lateral sides of high-K dielectric material layer 222(1)-222(3) in a first direction (Z-axis direction), inner spacers 224(1)-224(6) have been formed to define the width 228 in a second direction (X-axis direction) of the channel body 232. As can be seen in FIG. 2, the height 226 of the inner spacers 224(1)-224(6) has been advantageously reduced, as will be explained in more detail below. In one aspect, the inner spacers 224(1)-224(6) comprise a shape that tapers, or diminishes in height/thickness as the inner spacers 224(1)-224(6) extend away from the gate structures 210(1)-210(3) and towards the source electrode 202 or drain electrode 204.

In another exemplary aspect, reduced size/area of the inner spacers 224(1)-224(6) reduces gate parasitic capacitance of the GAA FET device for improved performance. The gate parasitic capacitance is reduced, because the surface area of the dielectric material that resides in the space between the gate structures 210(1)-210(3) and the enhanced extension regions 214(1)-214(6) is reduced. Reducing the permittivity of this material reduces the capacitance caused between the gate structures 210(1)-210(3) and the enhanced extension regions 214(1)-214(6).

Additional strain may also be imparted by the source electrode 202 and the drain electrode 204 on the channel structures 212(1)-212(3). This is because the reduced area of the inner spacers 224(1)-224(6) reduces the interruption in strain effect from differences in crystal lattice structure imposed by the source electrode 202 and the drain electrode on the channel structures 212(1)-212(3), and thus, the channel structures 212(1)-212(3) can be advantageously placed under increased compressive or tensile strain. Increasing strain on the channel structures of the GAA FET can increase its carrier mobility. For example, compressive strain on the channel structures 212(1)-212(3) can increase carrier mobility of a P-type semiconductor material (P) PFET. Tensile channel strain on channel structures 212(1)-212(3) can increase carrier mobility of an N-type semiconductor material (N) NFET.

Figure 3:
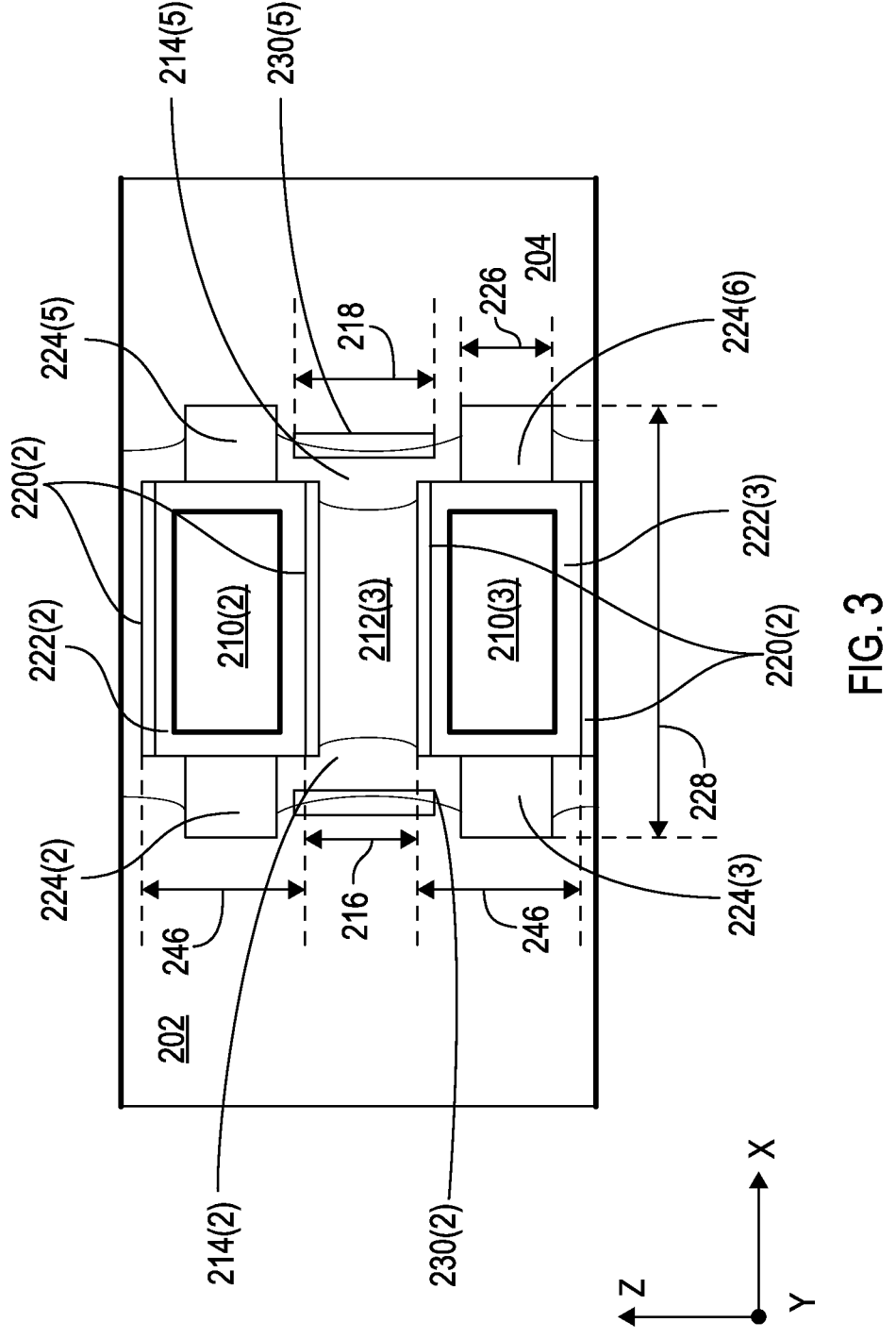
FIG. 3 is an exploded cross-sectional view of a channel structure surrounded by a gate of the GAA FET device in FIG. 2.

FIG. 3 is an exploded, cross-sectional view across a channel structure of the GAA FET device 200 in FIG. 2 and will be discussed in conjunction with FIG. 2. As discussed in more detail below, the enhanced extension regions 214(2) and 214(5) have been formed with enhanced extension portions 230(2) and 230(5) with an enhanced shape that has an extended height 218 (e.g., in the Z-axis direction) orthogonal to the channel direction (e.g., in the X-axis or Y-axis direction), and which is greater than a height 216 of the channel structure 212(2).

In the example shown, both of the enhanced extension regions 214(2) and 214(5) have end portions that are enhanced in size with enhanced extension portions 230(2) and 230(5). However, one skilled in the art will recognize that any number of enhanced extension regions 214(1)-214(6) may be enhanced or not depending on the desired characteristics and performance of the GAA FET device 200. In this manner, the enhanced extension regions 214(1)-214(6) with their enhanced extension portions 230(1)-230(6) have a reduced resistance as compared to an extension region not containing the enhanced extension portions, thus reducing the parasitic resistance caused by enhanced extension regions 214(1)-214(6) of the GAA FET device 200 for improved device performance. As noted, this is because the increased size of the enhanced extension portions 230(1)-230(6) reduces resistivity by providing a broader carrier pathway between the source and drain electrodes 202 and 204 and the channel 208 of the GAA FET device 200.

In another exemplary aspect, as discussed in more detail below, the enhanced extension portions 230(1)-230(6) of the GAA FET device 200 result from inner spacers 224(2), 224(3), 224(5), and 224(6) that are adjacent (in the Z-axis direction) to the gate structures 210(2) and 210(3) and have a reduced height 226. For example, as shown, inner spacers 224(2), 224(3), 224(5), and 224(6) have a height 226 that is less than a height 246 of the gate structures 210(2) and 210(3). This reduced height 226 and area of the inner spacers 224(1)-224(6) reduces gate parasitic capacitance of the GAA FET device 200 for improved performance. As noted, the gate parasitic capacitance is reduced because there is now less surface area of dielectric material, such as high-K dielectric layers 222(2) and 222(3), between the enhanced extension regions 214(2) and 214(5) and between the gate structures 210(2) and 210(3).

Additional strain may also be imparted by the source and drain electrodes 202 and 204 to the channel structures 212(1)-212(3) of the GAA FET device 200 because the inner spacers 224(2) and 224(5) are reduced in size, i.e., the reduced height 226. For example, as shown in FIG. 3, the inner spacers 224(2), 224(3), 224(5) and 224(6) have a reduced height 226 (e.g., in the Z-axis direction).

The shaping of the enhanced extension regions 214(1)-214(6) and inner spacers 224(1)-224(6) may be varied based on desired dimensions and the characteristics of the processes used to form these elements. For example, the enhanced extension regions 214(1)-214(6) may have an increasing height or thickness as they extend respectively towards source electrode 202 or drain electrode 204. The enhanced extension regions 214(1)-214(6) may also have a plurality of distinct, different levels of heights 218 in the vertical direction (e.g., the Z-axis direction), i.e., a first height the same as the channel height 216 and a second height 218 that is greater than the channel height 216. For example, the enhanced extension regions 214(1)-214(6) may be provided to form a symmetric shape around a center of the channel 208 and channel body 232 along the vertical (e.g., Z-axis) direction for the channel structures 212(1)-212(3), such as dumbbell or barbell shaped to form a dumbbell-shaped channel structure. The enhanced extension regions 214(1)-214(6) may also be asymmetric, e.g., they may have different dimensions from each other depending on whether they extend to source electrode 202 or drain electrode 204, or may be enhanced on one side of the channel, e.g., on one of electrodes 202 or 204.

The channel structures 212(1)-212(3) may be a material that is doped for a specific type of carrier, such as holes for a P-type channel, or electrons for a N-type channel. Doping for a specific type of carrier may be performed to introduce desired impurities and may be performed using ion implantation, diffusion, or during epitaxial growth. This allows the GAA FET device 200 to be configured as an N-type or a P-type device. In another aspect, the reduced size of the inner spacers 224(1)-224(6) allow for greater strain to be applied to the channel structures 212(1)-212(3) by source and drain electrodes 202 and 204. For example, for P-type carriers, a compressive strain on the channel structures may be applied, or for N-type carriers, a tensile strain on the channel structures may be applied.

Figure 4:
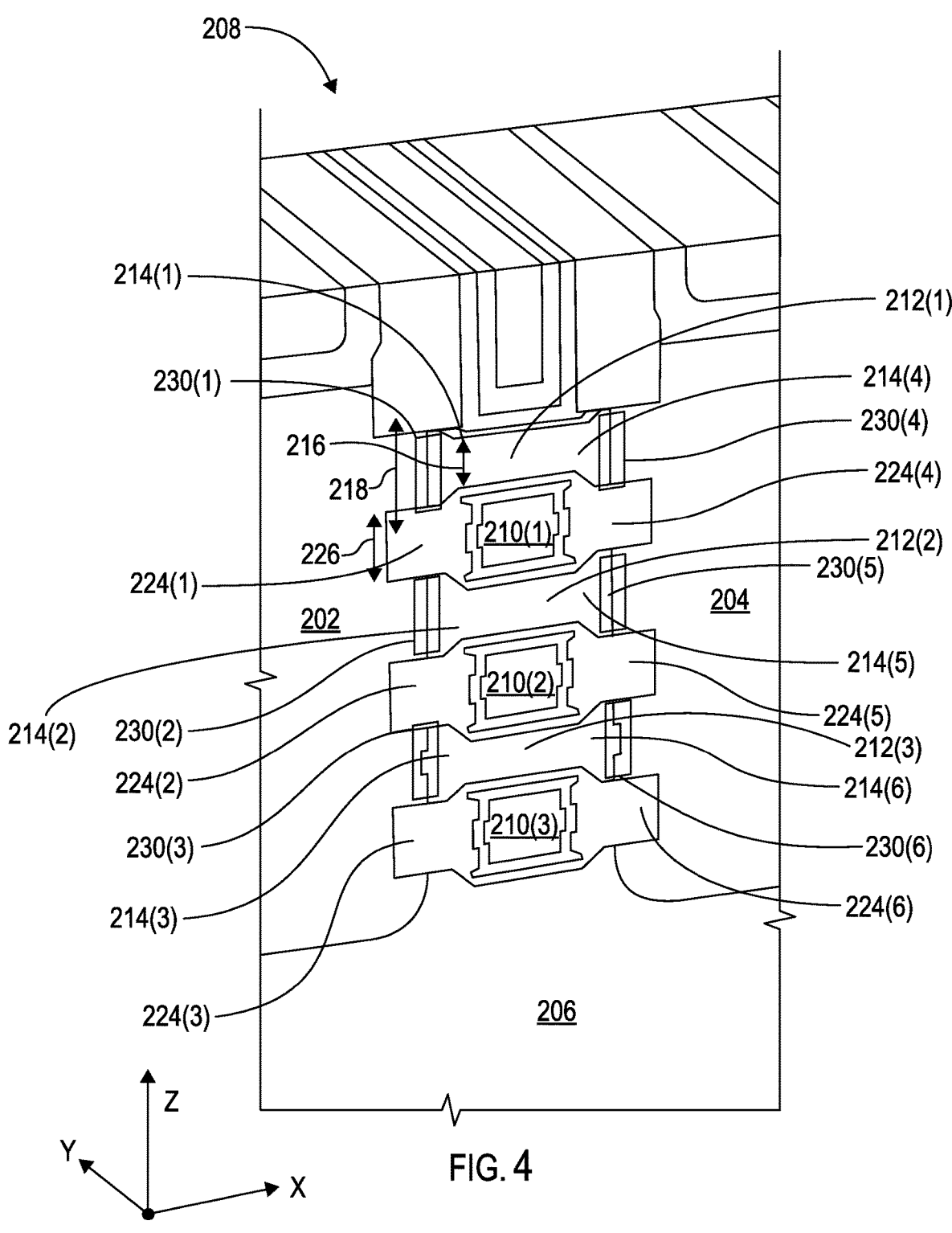
FIG. 4 is perspective view of a portion of the GAA FET in FIGS. 2 and 3 and an exploded view of a portion of FIG. 5.

With reference now to FIG. 4, a perspective view of a portion of the GAA FET devices in FIGS. 2 and 3 is shown. As can be seen, the GAA FET device 200 comprises a channel 208 with a channel body 232 having a stack of channel structures 212(1)-212(3) and gate structures 210(1)-210(3). Notably, the inner spacers 224(1)-224(6) have a reduced height 226.

In addition, the enhanced extension regions 214(1)-214(6) extending from channel structures 212(1)-212(3) have end portions that are enhanced extension portions 230(1)-230(6). In one aspect, the reduced height of the inner spacers 224(1)-224(6) provide an increased space for formation of the enhanced extension portions 230(1)-230(6) to be correspondingly larger.

Figure 5:
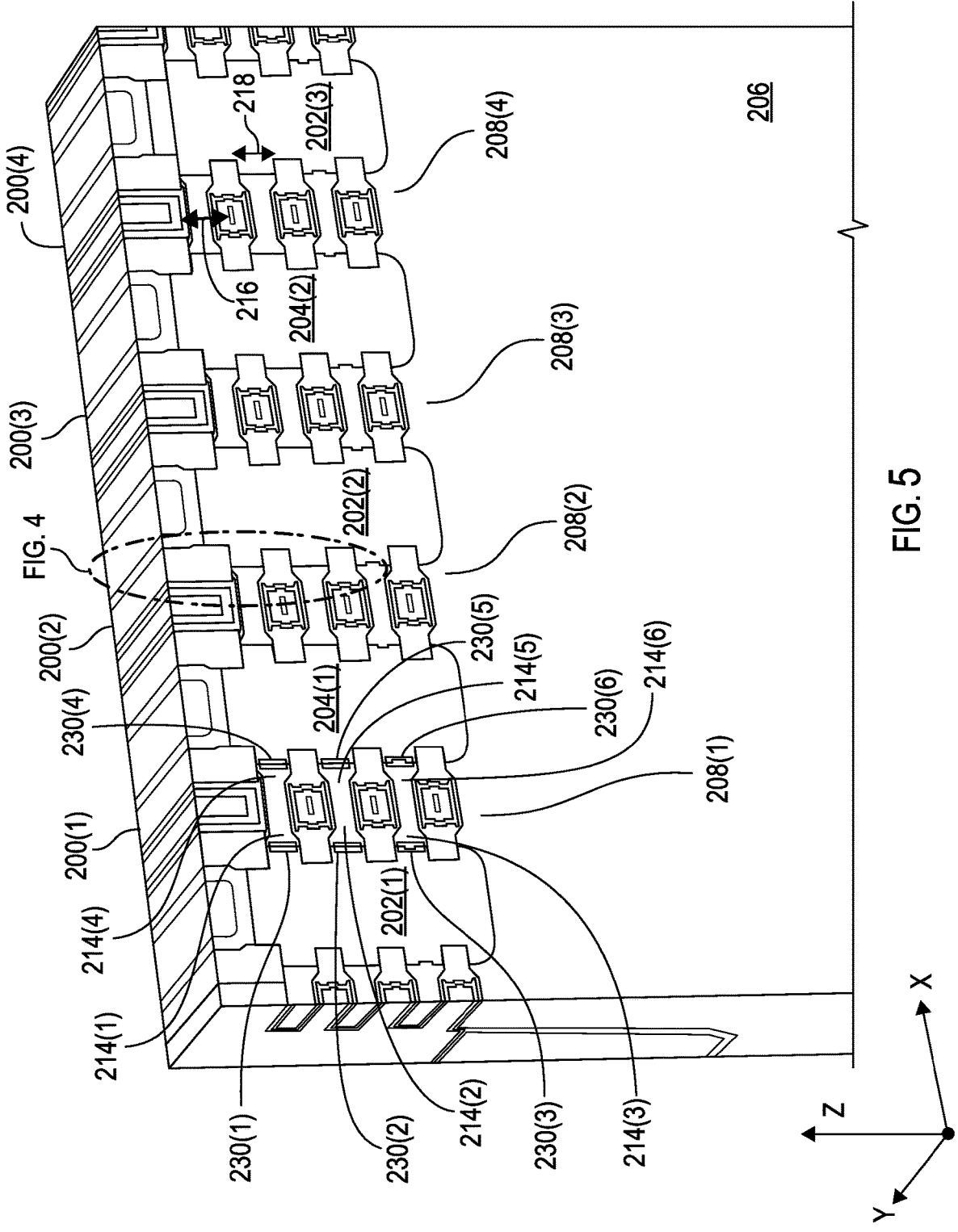
FIG. 5 is a perspective view of a plurality of GAA FETs, such as the GAA FET in FIGS. 2-4, the plurality of GAA FETs each having an enhanced extension region between the electrodes providing source/drain regions and the channel, wherein the enhanced extension region has an enhanced extension portion of reduced resistance to reduce channel parasitic resistance and/or reduce gate parasitic capacitance.

FIG. 5 is a perspective view of a plurality of GAA FET devices 200(1)-200(4) that are each like the GAA FET device 200 in FIGS. 2-4. For example, as shown, the GAA FET devices 200(1)-200(4) may each comprise respective channels 208(1)-208(4) interleaved between respective source electrodes 202(1)-202(3) and drain electrodes 204(1)-204(2) that serve as source regions and drain regions for the GAA FET devices 200(1)-200(4) provided on the substrate 206. In an exemplary aspect, the plurality of GAA FET devices 200(1)-200(4) each have respective enhanced extension regions 214(1)-214(6) with enhanced extension portions 230(1)-230(6) between the source/drain electrodes 202(1)-202(3) and 204(1)-204(2) and the channels 208(1)-208(4).

Fabrication processes can be employed to fabricate a GAA FET device having an enhanced extension region between the source/drain regions and the channel, wherein the enhanced extension region has an enhanced extension portion of reduced resistance to reduce channel parasitic resistance and/or reduce gate parasitic capacitance, including but not limited to the GAA FET devices 200, 200(1)-200(4) in FIGS. 2-5.

In this regard, FIG. 6 is a flowchart illustrating an exemplary fabrication process 600 of fabricating a GAA FET device having an enhanced extension region between the source/drain regions and the channel, wherein the enhanced extension region has an enhanced extension portion of reduced resistance to reduce channel parasitic resistance and/or reduce gate parasitic capacitance. The fabrication process 600 in FIG. 6 is discussed with regard to GAA FET devices 200, 200(1)-200(4) having enhanced extension regions 214(1)-214(6) with enhanced extension portions 230(1)-230(6) shown in FIGS. 2-5, but note that the fabrication process 600 in FIG. 6 is not limited to fabricating the GAA FET devices 200, 200(1)-200(4) in FIGS. 2-5.

In this regard, a first exemplary step in fabrication process 600 can be to form a first electrode 202, such as for a source, on a substrate 206 (block 602 in FIG. 6). A next step in the fabrication process 600 can be to form a second electrode 204, such as for a drain, on the substrate 206 (block 604 in FIG. 6). A next step in the fabrication process 600 can be to form a channel 208 extending in a first direction between the first electrode 202 and the second electrode 204 (block 606 in FIG. 6). As noted, the channel 208 and channel body 232 may have a first width 228 in the first direction, the channel 208 comprising one or more channel structures 212(1)-212 (3), each having a first height 216 in a second direction orthogonal to the first direction. In a next step in the fabrication process 600, a gate 234 is formed from gate structures 210(1), 210(2), and 210(3) surrounding the channel structures 212(1)-212(3) (block 608 in FIG. 6). In a next step in the fabrication process 600, one or more enhanced extension regions 214(1)-214(3) can be formed, each extending from the channel structure 212(1)-212(3) of the one or more channel structures 212(1)-212(3) to the first electrode 202 and the enhanced extension regions 214(1)-214(6) each having one or more first enhanced extension portions 230(1)-230(6) each having a second height 218 in the second direction greater than the first height 216 (block 610 in FIG. 6). An example of these shapes for the extension regions is shown with reference to FIGS. 2-4.

Other fabrication processes can also be employed to fabricate a GAA FET device having enhanced extension regions, including but not limited to such being formed as a result of forming inner spacers that are reduced in height, wherein such enhanced extension regions are in extension regions between the source/drain regions and the channel, wherein the enhanced extension region has an enhanced extension portion of reduced resistance to reduce channel parasitic resistance and/or reduce gate parasitic capacitance, including but not limited to the GAA FET devices 200, 200(1)-200(4) in FIGS. 2-5. In this regard, FIGS. 7A-7F is a flowchart illustrating another exemplary fabrication process 700 of fabricating a GAA FET device having an enhanced extension region between the source/drain regions and the channel, wherein the enhanced extension region has an enhanced extension portion of reduced resistance to reduce channel parasitic resistance and/or reduce gate parasitic capacitance, including but not limited to the GAA FET devices 200, 200(1)-200(4) in FIGS. 2-5. FIGS. 8A-8F are exemplary fabrication stages during fabrication of a GAA FET device having an enhanced extension region between the source/drain regions and the channel, according to the exemplary fabrication process in FIGS. 7A-7F. FIGS. 7A-7F and 8A-8F will now be discussed in conjunction.

Figures 7A, 8A:
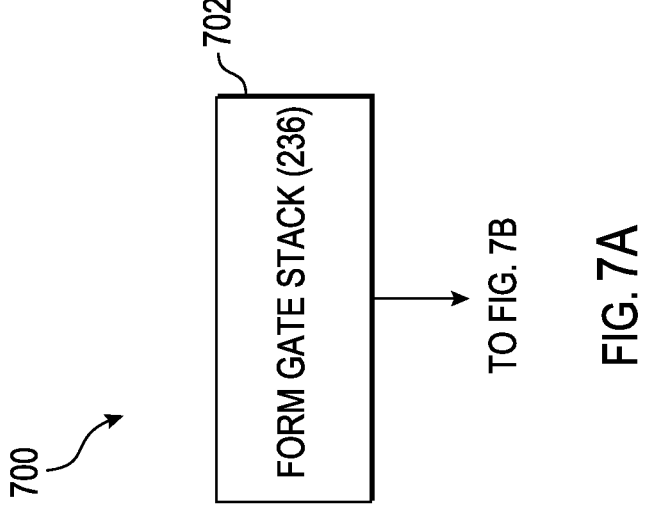
FIGS. 7A-7F is a flowchart illustrating another exemplary fabrication process for fabricating a GAA FET device having an enhanced extension region between the electrodes providing source/drain regions and the channel, wherein the enhanced extension region has an enhanced extension portion of reduced resistance to reduce channel parasitic resistance and/or reduce gate parasitic capacitance, including but not limited to the GAA FET devices in FIGS. 2-5.
FIGS. 8A-8F are exemplary fabrication stages during fabrication of a GAA FET device having an enhanced extension region between the electrodes providing source/drain regions and the channel, according to the exemplary fabrication process in FIGS. 7A-7F.

In this regard, as shown in the exemplary fabrication stage 800A in FIG. 8A, after the substrate 206 has been prepared, a first step in the fabrication process 700 is to form a gate stack 236 on the substrate 206, which is typically made of silicon or another semiconductor material (block 702 in FIG. 7A). The gate stack 236 serves as the starting material for formation of the channel structures 212(1)-212(3). For example, the gate stack 236 may include alternating layers of Si 238(1)-238(3) and layers of SiGe 240(1)-240(3) provided via chemical vapor deposition or molecular beam epitaxy to deposit each layer on top of each other. In one aspect, the gate stack 236 comprises alternating layers of Si 238(1)-238(3) that are five (5) nm thick and layers of SiGe 240(1)-240(3) that are ten (10) nm thick. As also shown in FIG. 8A, a pattern 242 comprising spacer images 244(1)-244(6) is provided on the gate stack 236 to establish the pattern and eventually the fin-like shape for a channel body 232.

Figures 7B, 8B:
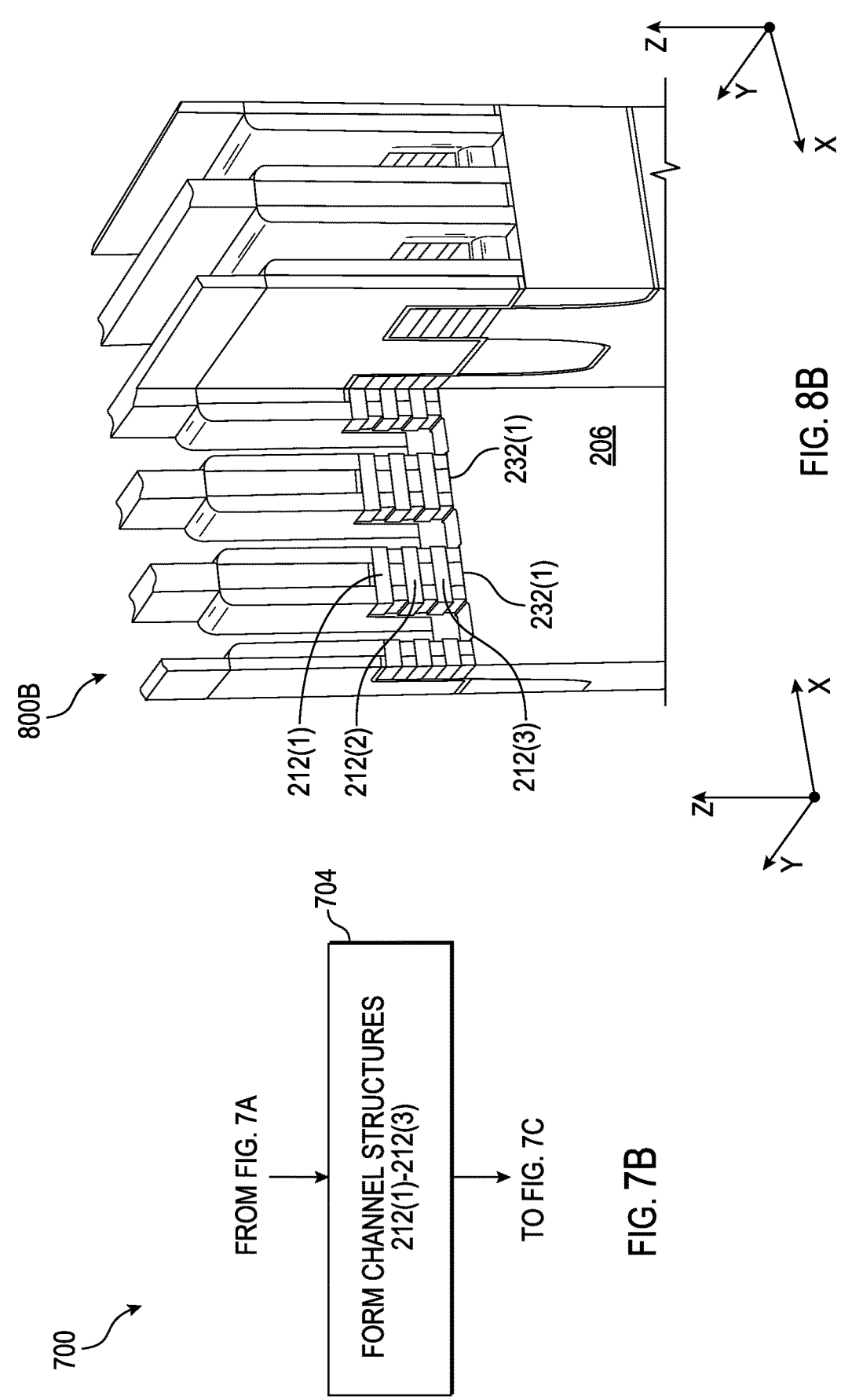

Next, as shown in the exemplary fabrication stage 800B in FIG. 8B, the channel structures 212(1)-212(3) are formed (block 704 in FIG. 7B) in a stack arrangement for channel bodies 232(1), 232(2), etc. As shown in FIG. 8B, in an aspect, a combination of lithography is used to pattern the layers of Si 238(1)-238(3) in the gate stack 236 to a thickness of seven (7) nm and removing, for example by etching, of the sacrificial SiGe layers 240(1)-240(3) in the gate stack 236 to a thickness of eight (8) nm. This etching creates recesses that will become adjacent to the channel structures 212(1)-212(3). In an aspect, an anisotropic etch is also employed to create space for the source electrode 202, drain electrode 204, and recesses that will become adjacent to the channel structures 212(1)-212(3).

Figure 8C:
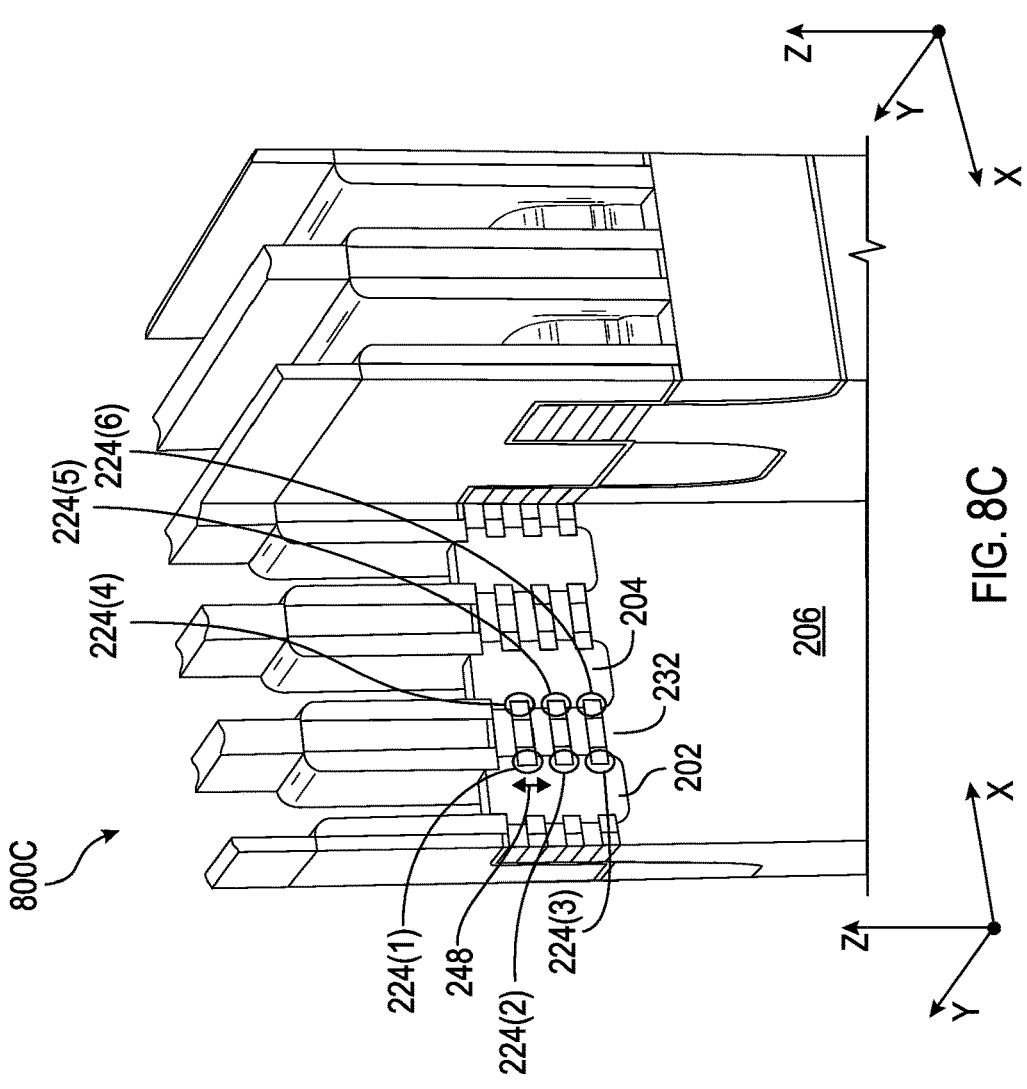
Figure 7C:
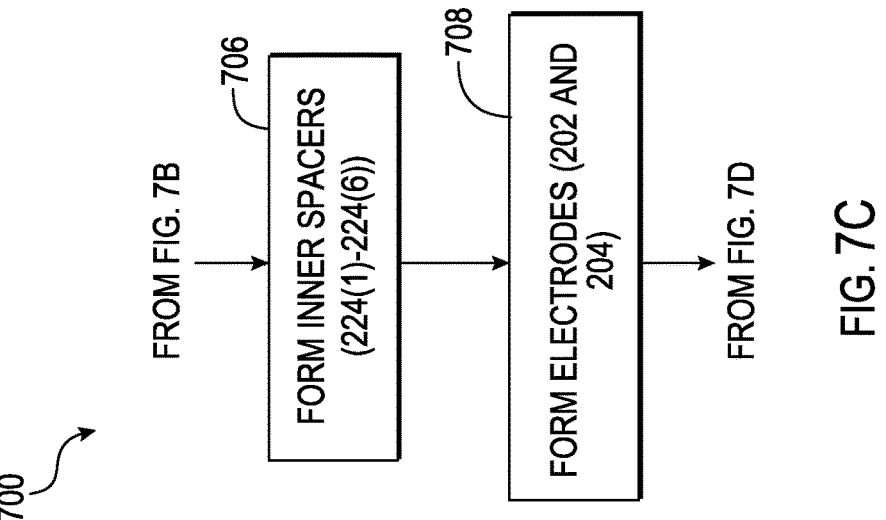

Then, as shown in the exemplary fabrication stage 700C in FIG. 8C, the inner spacers 224(1)-224(6) are formed in the recesses created by the etching performed in fabrication stage 700B in FIG. 7B (block 706 in FIG. 7C) based on deposition and/or etching of an insulating material, such as silicon nitride or silicon dioxide. Of note, the height of the inner spacers 224(1)-224(6) are of an initial height 248 that corresponds to the thickness of the sacrificial SiGe layers 240(1)-240(3). Next, the source electrodes 202 and drain electrodes 204 are then formed based on epitaxial growth in the spaces adjacent to channel bodies 232 (block 708 in FIG. 7C). In one aspect, doping is performed by ion implantation to form the source electrodes 202 and drain electrodes 204, such as phosphorous or arsenic ions for N-type, or boron ion for P-type. Annealing may also be performed to activate the dopants and repair any damage caused to the channel bodies 232 and channel structures 212(1)-212(3) by the ion implantation.

Figures 7D, 8D:
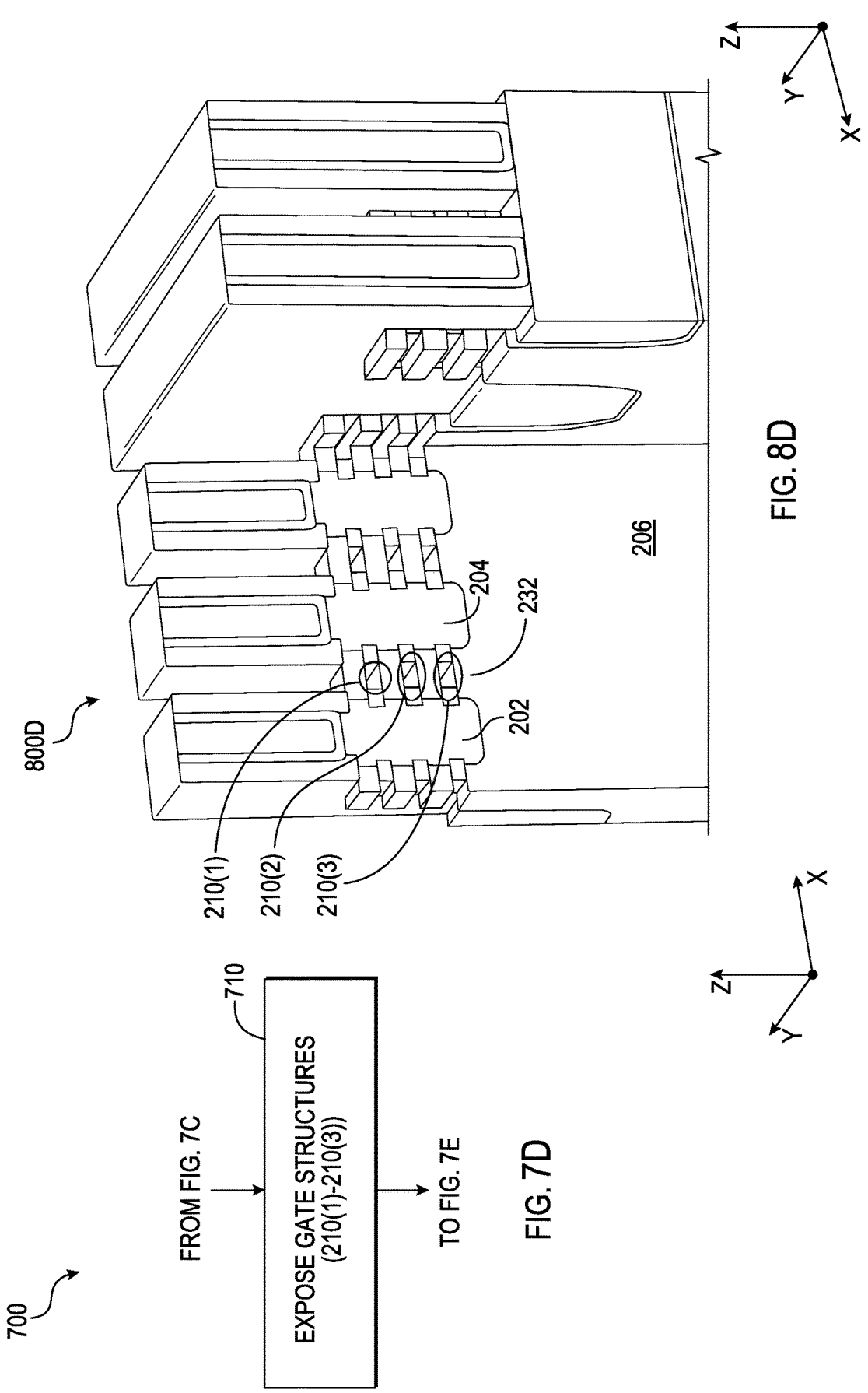

Then, as shown in the exemplary fabrication stage 800D in FIG. 8D, a space for the gate structures 210(1)-210(3) is exposed by removing, e.g., by etching, portions of the sacrificial layers of SiGe 240(1)-240(3) in the gate stack 236 (block 710 in FIG. 7D).

Figures 7E, 8E:
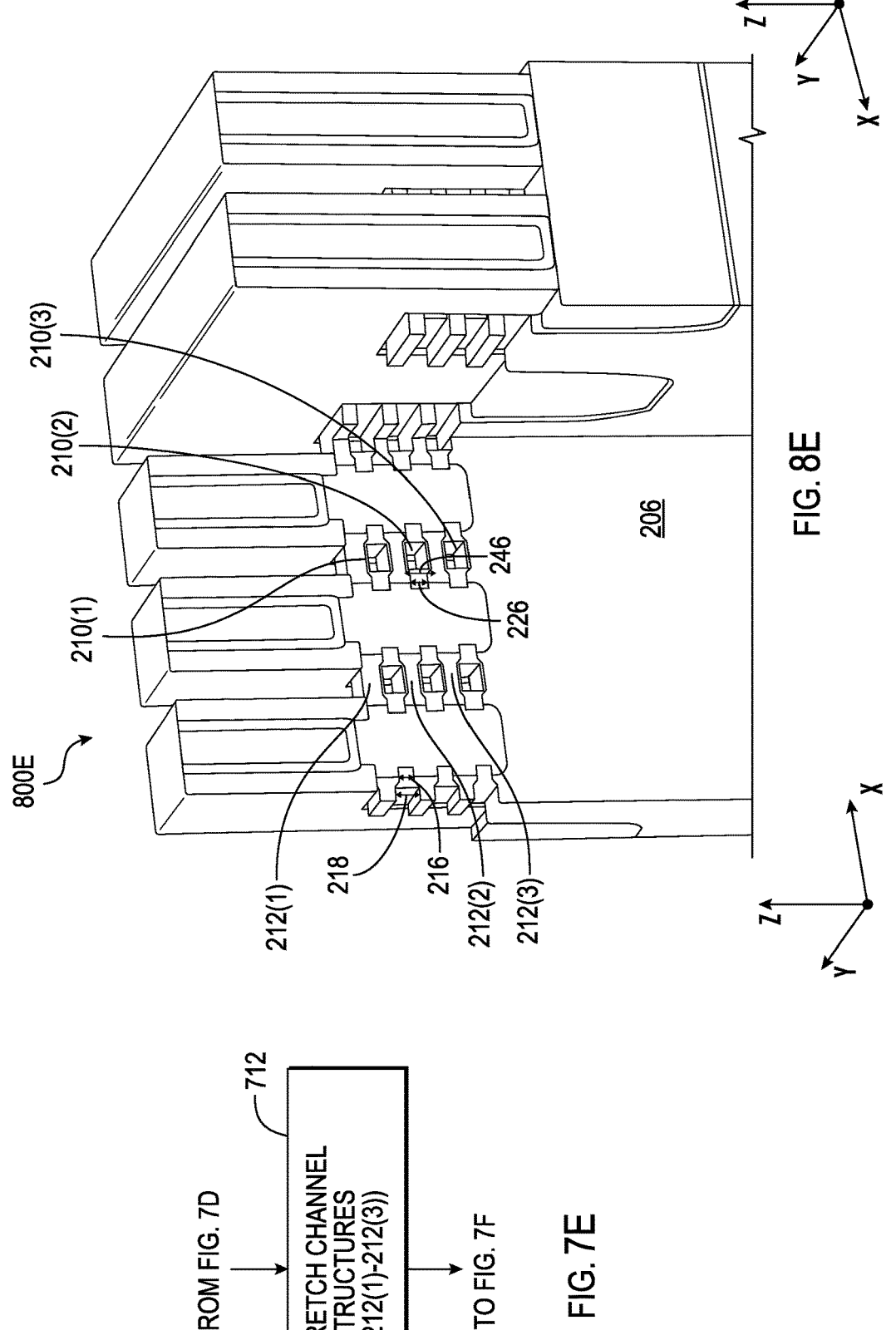

In fabrication stage 800E, according to an aspect, an additional etching, or overetch, is performed. This additional etching has the effect of increasing the height 216 of the recesses adjacent to the channel structures 212(1)-212(3), which provides an increased height 218 for enhanced extension portions 230(1)-230(6) for enhanced extension regions 214(1)-214(3). Accordingly, this additional or overetch increases the height of the recess to height 218, which is greater than the height 216 of the channel structures 212 (1)-212(3) of the channel body 232 that were formed from part of the original semiconductor material layers of Si 238(1)-238(3) to maintain the height of the channel structures that were not of the increased thickness of the original semiconductor material layer. As will be further described, the increased height 218 provides additional space for forming enhanced extension portions 230(1)-230(6). Correspondingly, this overetch also decreases the height of the inner spacers 224(1)-224(6) to a height 226. As shown in FIG. 8E, the inner spacers 224(1)-224(6) now have a height 226 that is less than a height 246 of the space for gate structures 210(1)-210(3) that were formed previously in fabrication stage 700D in FIG. 7D (block 712 in FIG. 7E). In one aspect, as shown in FIG. 8E, an isotropic overetch thins down the inner spacers 224(1)-224(6) from eight (8) nm to five (5) nm (block 712 in FIG. 7E).

Figures 7F, 8F:
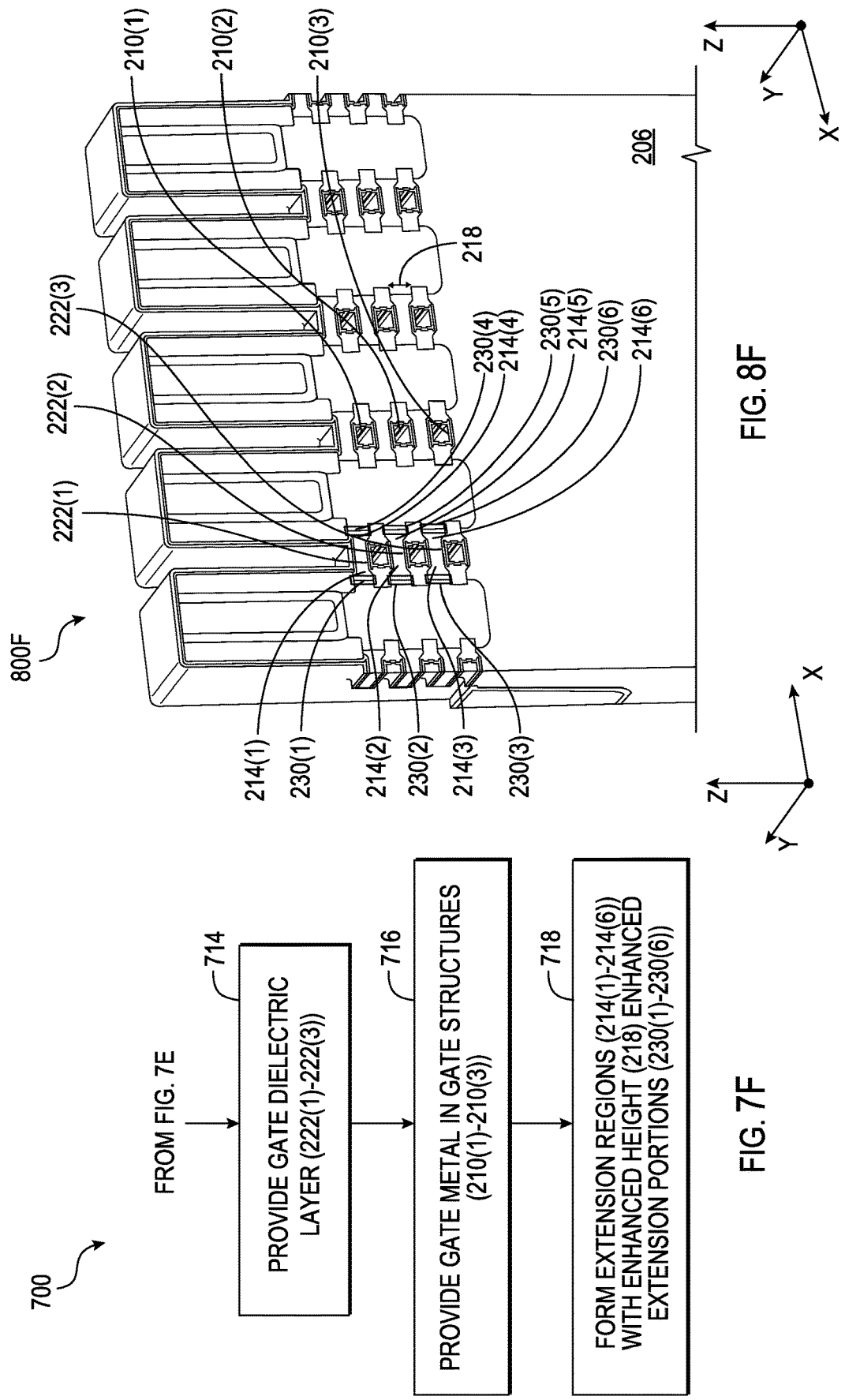

In fabrication stage 800F, high-K dielectric layers 222(1)-222(3) are formed on the exposed gate structures 210(1)-210(3), which separate the gate structures 210(1)-210(3) from the channel structures 212(1)-212(3). In addition, gate metal is provided on top of the channel body 232 to form the gate 234 of the GAA FET device 200. In one aspect, as shown in FIG. 8F, the thickness of the high-K dielectric layers 222(1)-222(3) is typically a few nanometers and can be formed using techniques such as thermal oxidation, chemical vapor deposition (CVD), or atomic layer deposition (ALD). After formation of the high-K dielectric layers 222(1)-222(3), the remaining recess still has an increased height 218 that is greater than the height of the channel structures 212(1)-212(3). Next, the enhanced extension regions 214(1)-214(3) are formed using epitaxial growth in the remaining recess having a height 218. The material for the enhanced extension regions 214(1)-214(3) may comprise materials such as silicon, germanium, or III-IV compound and doped with a known doping process, such as ion implantation, to couple the channel structures 212(1)-212(3) to the source electrode 202 and drain electrode 204. Accordingly, the enhanced extension regions 214(1)-214(3) have enhanced extension portions 230(1)-230(6) that have an increased height 218 that is greater than the height 216 of the channel structures 212(1)-212(3). Following stage 700F, other known processes may be performed to complete the formation of the GAA FET device 200, such as annealing, contact formation, middle of line ("MOL") processes, and back end of line ("BEOL") processes.

Electronic devices that include a GAA FET device having an enhanced extension region between the source/drain regions and the channel, wherein the enhanced extension region has an enhanced extension portion of reduced resistance to reduce channel parasitic resistance and/or reduce gate parasitic capacitance, including but not limited to the GAA FET devices 200, 200(1)-200(4) in FIGS. 2-5 and 8A-8F, and fabricated according to, but not limited to, any of the exemplary fabrication processes 600, 700 in FIGS. 6 and 7A-7F, and according to any aspects disclosed herein, may be provided in or integrated into any processor-based device.

GAA FET devices having an enhanced extension region between the source/drain regions and the channel, wherein the enhanced extension region has an enhanced extension portion of reduced resistance to reduce channel parasitic resistance and/or reduce gate parasitic capacitance, including but not limited to the GAA FET devices 200, 200(1)-200(4) in FIGS. 2-5 and 8-8F, and fabricated according to, but not limited to, any of the exemplary fabrication processes 600, 700 in FIGS. 6 and 7A-7F, and according to any aspects disclosed herein can be provided in an IC package provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 9:
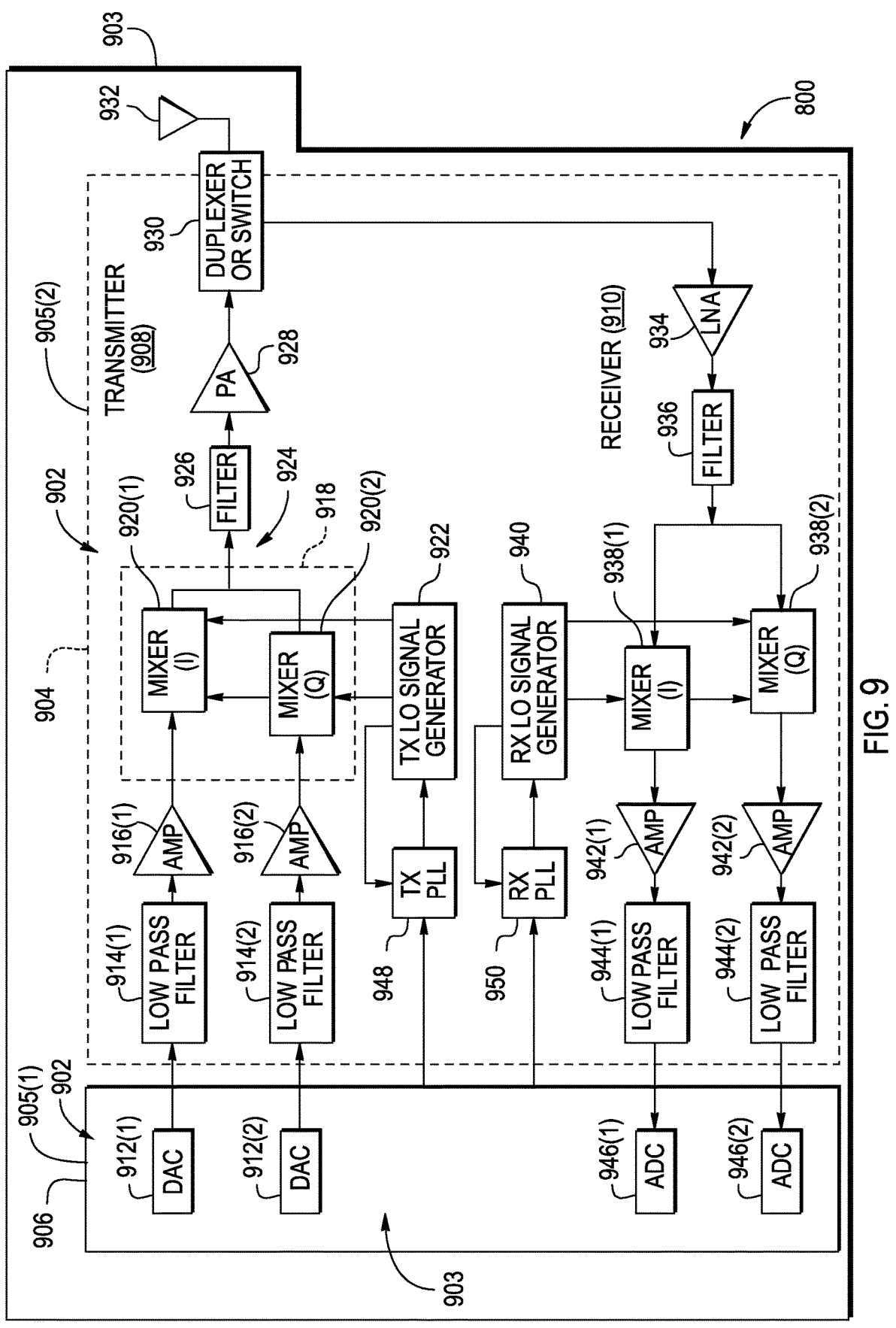
FIG. 9 is a block diagram of an exemplary wireless communications device that includes radio-frequency (RF) components formed in an integrated circuit (IC), wherein the RF components can include a GAA FET device(s) having an enhanced extension region between the source/drain regions and the channel, wherein the enhanced extension region has an enhanced extension portion of reduced resistance to reduce channel parasitic resistance and/or reduce gate parasitic capacitance, including but not limited to the GAA FET devices in FIGS. 2-5, and that can be fabricated according to the fabrication processes in FIGS. 6, 7A-7F, and 8A-8F.

In this regard, the wireless communications device 900 may be provided in an integrated circuit (IC) 902. The wireless communications device 900 may include GAA FET devices 903 having an enhanced extension region between the source/drain regions and the channel, wherein the enhanced extension region has an enhanced extension portion of reduced resistance to reduce channel parasitic resistance and/or reduce gate parasitic capacitance, including but not limited to any of the GAA FET devices 200, 200(1)-200(4) in FIGS. 2-5 and 8-8F, and fabricated according to, but not limited to, any of the exemplary fabrication processes 600, 700 in FIGS. 6 and 7A-7F, and according to any aspects disclosed herein. As shown in FIG. 9, the wireless communications device 900 includes a transceiver 904 and a data processor 906. The transceiver 904 and/or the data processor 906 may include respective GAA FET devices 903(1), 903(2). The data processor 906 may include a memory (not shown) to store data and program codes. The transceiver 904 includes a transmitter 908 and a receiver 910 that support bi-directional communication. In general, the wireless communications device 900 may include any number of transmitters and/or receivers for any number of communication systems and frequency bands. All or a portion of the transceiver 904 may be implemented on one or more analog ICs, RF ICs (RFICs), mixed-signal ICs, etc.

A transmitter or a receiver may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the wireless communications device 900 in FIG. 9, the transmitter 908 and the receiver 910 are implemented with the direct-conversion architecture.

In the transmit path, the data processor 906 processes data to be transmitted and provides I and Q analog output signals to the transmitter 908. In the exemplary wireless communications device 900, the data processor 906 includes digital-to-analog-converters (DACs) 912(1) and 912(2) for converting digital signals generated by the data processor 906 into the I and Q analog output signals, e.g., I and Q output currents, for further processing.

Within the transmitter 908, lowpass filters 914(1), 914(2) filter the I and Q analog output signals, respectively, to remove undesired signals caused by the prior digital-to-analog conversion. Amplifiers (AMP) 916(1), 916(2) amplify the signals from the lowpass filters 914(1), 914(2), respectively, and provide I and Q baseband signals. An upconverter 918 upconverts the I and Q baseband signals with I and Q transmit (TX) local oscillator (LO) signals through mixers 920(1), 920(2) from a TX LO signal generator 922 to provide an upconverted signal 924. A filter 926 filters the upconverted signal 924 to remove undesired signals caused by the frequency upconversion as well as noise in a receive frequency band. A power amplifier (PA) 928 amplifies the upconverted signal 924 from the filter 926 to obtain the desired output power level and provides a transmit RF signal. The transmit RF signal is routed through a duplexer or switch 930 and transmitted via an antenna 932.

In the receive path, the antenna 932 receives signals transmitted by base stations and provides a received RF signal, which is routed through the duplexer or switch 930 and provided to a low noise amplifier (LNA) 934. The duplexer or switch 930 is designed to operate with a specific RX-to-TX duplexer frequency separation, such that RX signals are isolated from TX signals. The received RF signal is amplified by the LNA 934 and filtered by a filter 936 to obtain a desired RF input signal. Downconversion mixers 938(1), 938(2) mix the output of the filter 936 with I and Q receive (RX) LO signals (i.e., LO_I and LO_Q) from an RX LO signal generator 940 to generate I and Q baseband signals. The I and Q baseband signals are amplified by amplifiers (AMP) 942(1), 942(2) and further filtered by lowpass filters 944(1), 944(2) to obtain I and Q analog input signals, which are provided to the data processor 906. In this example, the data processor 906 includes analog-to-digital-converters (ADCs) 946(1), 946(2) for converting the analog input signals into digital signals to be further processed by the data processor 906.

In the wireless communications device 900 in FIG. 9, the TX LO signal generator 922 generates the I and Q TX LO signals used for frequency upconversion, while the RX LO signal generator 940 generates the I and Q RX LO signals used for frequency downconversion. Each LO signal is a periodic signal with a particular fundamental frequency. A transmit (TX) phase-locked loop (PLL) circuit 948 receives timing information from the data processor 906 and generates a control signal used to adjust the frequency and/or phase of the TX LO signals from the TX LO signal generator 922. Similarly, a receive (RX) phase-locked loop (PLL) circuit 950 receives timing information from the data processor 906 and generates a control signal used to adjust the frequency and/or phase of the RX LO signals from the RX LO signal generator 940.

Figure 10:
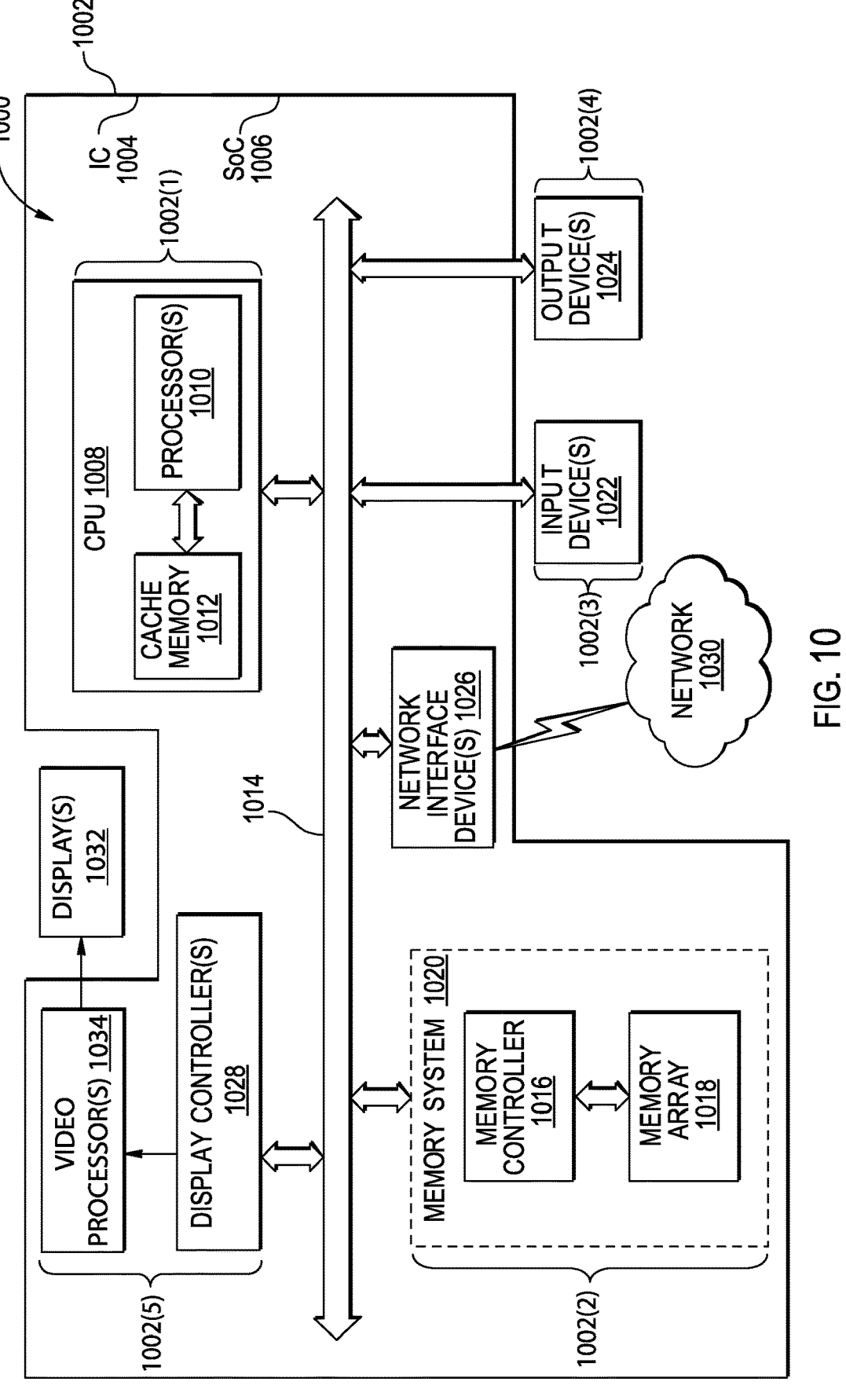
FIG. 10 is a block diagram of an exemplary processor-based system that can include a GAA FET device(s) having an enhanced extension region between the source/drain regions and the channel, wherein the enhanced extension region has an enhanced extension portion of reduced resistance to reduce channel parasitic resistance and/or reduce gate parasitic capacitance, including but not limited to the GAA FET devices in FIGS. 2-5, and that can be fabricated according to the fabrication processes in FIGS. 6, 7A-7F, and 8A-8F.

FIG. 10 is a block diagram of an exemplary processor-based system 1000 that can include a GAA FET device(s) 1002(1)-1002(5) having an enhanced extension region between the source/drain regions and the channel, wherein the enhanced extension region has an enhanced extension portion of reduced resistance to reduce channel parasitic resistance and/or reduce gate parasitic capacitance including but not limited to any of the GAA FET devices 200, 200(1)-200(4) in FIGS. 2-5 and 8-8F, and fabricated according to, but not limited to, any of the exemplary fabrication processes 600, 700 in FIGS. 6 and 7A-7F, and according to any aspects disclosed herein. In this example, the processor-based system 1000 can be provided wholly or partly in an IC 1004 that can be a system-on-chip (SoC) 1006 as an example. The processor-based system 1000 includes a CPU 1008 that includes one or more processor(s) 1010. The CPU 1008 may have cache memory 1012 coupled to the processor(s) 1010 for rapid access to temporarily stored data. The cache memory 1012 may include GAA FET device 1002 employing channel structures that include channel structures. The CPU 1008 is coupled to a system bus 1014 and can intercouple master and slave devices included in the processor-based system 1000. As is well known, the CPU 1008 communicates with these other devices by exchanging address, control, and data information over the system bus 1014. Although not illustrated in FIG. 10, multiple system buses 1014 could be provided, wherein each system bus 1014 constitutes a different fabric. For example, the CPU 1008 can communicate bus transaction requests to a memory system 1020 as an example of a slave device. The memory system 1020 may include memory structures or arrays that include GAA FET device(s) 1002(2) employing enhanced extension regions, as an example.

Other master and slave devices can be connected to the system bus 1014. As illustrated in FIG. 10, these devices can include the memory system 1020, one or more input devices 1022, which can include a GAA FET device(s) 1002(3) as an example, one or more output devices 1024 which can include a GAA FET device(s) 1002(4), one or more network interface devices 1026, which can include GAA FET device(s) 1002(5) employing channel structures that include channel structures as an example, and one or more display controllers 1028, including GAA FET device 1002(6), as examples. The input device(s) 1022 can include any type of input device, including but not limited to input keys, switches, voice processors, etc. The output device(s) 1024 can include any type of output device, including but not limited to audio, video, other visual indicators, etc. The network interface device(s) 1026 can be any devices configured to allow exchange of data to and from a network 1030. The network 1030 can be any type of network, including but not limited to a wired or wireless network, a private or public network, a local area network (LAN), a wireless local area network (WLAN), a wide area network (WAN), a BLUETOOTH™ network, and the Internet. The network interface device(s) 1022 can be configured to support any type of communications protocol desired.

The GAA FET device(s) 1002 may also be configured to access the display controller(s) 1028 over the system bus 1014 to control information sent to one or more displays 1032. The display controller(s) 1028 sends information to the display(s) 1032 to be displayed via one or more video processors 1034, which process the information to be displayed into a format suitable for the display(s) 1032. The video processor(s) 1034 can include GAA FET device 1002(6) employing channel structures that include channel structures, as an example. The display(s) 1032 can include any type of display, including but not limited to a cathode ray tube (CRT), a liquid crystal display (LCD), a plasma display, etc.

Those of skill in the art will further appreciate that the various illustrative logical blocks, modules, circuits, and algorithms described in connection with the aspects disclosed herein may be implemented as electronic hardware, instructions stored in memory or in another computer-readable medium and executed by a processor or other processing device, or combinations of both. The master devices and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

Implementation examples are described in the following numbered clauses:

1. A gate-all-around (GAA) field effect transistor (FET) device, comprising:
   a first electrode on a substrate;
   a second electrode on the substrate;
   a channel extending in a first direction between the first electrode and the second electrode, the channel having a first width in the first direction, the channel comprising:
      one or more channel structures each having a first height in a second direction orthogonal to the first direction;
   a gate surrounding the channel;
   one or more first extension regions each extending from a channel structure of the one or more channel structures to the first electrode; and
   the one or more first extension regions each comprising:
      one or more first enhanced extension portions each having a second height in the second direction greater than the first height.

2. The GAA FET device of clause 1, further comprising:
   one or more second extension regions each extending from a channel structure of the one or more channel structures to the second electrode; and
   the one or more second extension regions each having the first height.

3. The GAA FET device of clause 1, further comprising:
   one or more second extension regions each extending from a channel structure of the one or more channel structures to the second electrode; and
   the one or more second extension regions each comprising:
      one or more second enhanced extension portions each having the second height in the second direction greater than the first height.

4. The GAA FET device of clause 3, wherein each channel structure of the one or more channel structures, a first extension region of the one or more first extension regions between the channel structure and the first electrode, and a second extension region of the one or more second extension regions between the channel structure and the second electrode are a dumbbell-shaped structure.

5. The GAA FET device of any of clauses 1-4, wherein:
   the gate comprises one or more gate structures each having a third height in the second direction and each disposed adjacent to at least one channel structure of the one or more channel structures in the second direction; and
   the gate further comprises:
      one or more inner spacers each adjacent to a gate structure of the one or more gate structures and each having a fourth height less than the third height.

6. The GAA FET device of clause 4, wherein the fourth height of an inner spacer of the one or more inner spacers tapers as the inner spacer extends away from its adjacent gate structure of the one or more gate structures.

7. The GAA FET device of any of clauses 1-6, wherein the one or more channel structures each comprise a nanowire.

8. The GAA FET device of any of clauses 1-6, wherein the one or more channel structures each comprise a nanoslab.

9. The GAA FET device of any of clauses 1-8, wherein the channel comprises a plurality of channel structures stacked within the first width.

10. The GAA FET device of any of clauses 1-9, wherein the first electrode comprises a source region and the second electrode comprises a drain region.

11. The GAA FET device of any of clauses 1-9, wherein the first electrode comprises a drain region and the second electrode comprises a source region.

12. The GAA FET device of any of clauses 1-11, wherein the channel comprises an N-type semiconductor material (N-type) channel.

13. The GAA FET device of clause 12, wherein the channel structure is under a tensile strain.

14. The GAA FET device of any of clauses 1-11, wherein the channel comprises a P-type semiconductor material (P-type) channel.

15. The GAA FET device of clause 14, wherein the channel structure is under a compressive strain.

16. The GAA FET device of any of clauses 1-15 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

17. A method of fabricating a gate-all-around (GAA) field effect transistor (FET) device, comprising:
   forming a first electrode on a substrate;
   forming a second electrode on the substrate;
   forming a channel extending in a first direction between the first electrode and the second electrode, the channel having a first width in the first direction, the channel comprising one or more channel structures each having a first height in a second direction orthogonal to the first direction;
   forming a gate surrounding the channel;
   forming one or more first extension regions each extending from a channel structure of the one or more channel structures to the first electrode; and
      the one or more first extension regions each comprising one or more first enhanced extension portions each having a second height in the second direction greater than the first height.

18. The method of clause 17, wherein:
   forming the channel comprises:
      forming one or more semiconductor material layers each having the second height in the second direction;
      etching at least a portion of the one or more semiconductor material layers to the first height to form the one or more channel structures each having the first height; and
   wherein the one or more extension regions comprise end portions of the one or more semiconductor layers having the second height in the second direction.

19. The method of clause 17 of 18, wherein a ratio of the second height to the first height is greater than 1.4.

20. The method of clause 17 of 18, wherein the first height is five (5) nanometers (nm) and the second height is eight (8) nm.

21. The method of clause 17, wherein forming the channel comprises:
   forming a plurality of semiconductor material layers each of the first height in the second direction; and
   forming a plurality of sacrificial layers interleaved with the plurality of semiconductor material layers each of a third height less than the first height in the second direction.

22. The method of clause 21, further comprising:
   removing the plurality of sacrificial layers;
   forming a gate structure of one or more gate structures of the gate between each channel structure of the one or more channel structures in the second direction; and
   forming one or more inner spacers each adjacent to a gate structure of the one or more gate structures and each having a fourth height less than the third height.

23. The method of any of clauses 17-22, further comprising:
   doping first portions of the first electrode to form the one or more first extension regions.

24. The method of any of clauses 17-22, further comprising:
   forming one or more second extension regions each extending from a channel structure of the one or more channel structures to the second electrode; and
   the one or more second extension regions each having the first height.

25. The method of any of clauses 17-22, further comprising:
   forming one or more second extension regions each extending from a channel structure of the one or more channel structures to the second electrode; and
   the one or more second extension regions each comprising:
      one or more second enhanced extension portions each having the second height in the second direction greater than the first height.

26. The method of clause 24, wherein each channel structure of the one or more channel structures, a first extension region of the one or more first extension regions between the channel structure and the first electrode, and a second extension region of the one or more second extension regions between the channel structure and the second electrode are a dumbbell-shaped structure.

What is claimed is:

1. A gate-all-around (GAA) field effect transistor (FET) device, comprising:
   a first electrode on a substrate;
   a second electrode on the substrate;
   a channel extending in a first direction between the first electrode and the second electrode, the channel having a first width in the first direction, the channel comprising:
      one or more channel structures each having a first height in a second direction orthogonal to the first direction;
   a gate surrounding the channel;
   one or more first extension regions each extending from a channel structure of the one or more channel structures to the first electrode; and the one or more first extension regions each comprising:
   one or more first enhanced extension portions each
      having a second height in the second direction
      greater than the first height;
   wherein:
      the gate comprises one or more gate structures each
         having a third height in the second direction and each
         disposed adjacent to at least one channel structure of
         the one or more channel structures in the second
         direction; and
      the gate further comprises:
         one or more inner spacers each adjacent to a gate
            structure of the one or more gate structures and
            each having a fourth height directly adjacent to the
            gate structure that is less than the third height.

2. The GAA FET device of claim 1, further comprising:
   one or more second extension regions each extending
      from a channel structure of the one or more channel
      structures to the second electrode; and
   the one or more second extension regions each having the
      first height.

3. The GAA FET device of claim 1, further comprising:
   one or more second extension regions each extending
      from a channel structure of the one or more channel
      structures to the second electrode; and
   the one or more second extension regions each compris-
      ing:
         one or more second enhanced extension portions each
            having the second height in the second direction
            greater than the first height.

4. The GAA FET device of claim 3, wherein each channel structure of the one or more channel structures, a first extension region of the one or more first extension regions between the channel structure and the first electrode, and a second extension region of the one or more second extension regions between the channel structure and the second electrode are a dumbbell-shaped structure.

5. The GAA FET device of claim 1, wherein the fourth height of an inner spacer of the one or more inner spacers tapers as the inner spacer extends away from its adjacent gate structure of the one or more gate structures.

6. The GAA FET device of claim 1, wherein the one or more channel structures each comprise a nanowire.

7. The GAA FET device of claim 1, wherein the one or more channel structures each comprise a nanoslab.

8. The GAA FET device of claim 1, wherein the channel comprises a plurality of channel structures stacked within the first width.

9. The GAA FET device of claim 1, wherein the first electrode comprises a source region and the second electrode comprises a drain region.

10. The GAA FET device of claim 1, wherein the first electrode comprises a drain region and the second electrode comprises a source region.

11. The GAA FET device of claim 1, wherein the channel comprises an N-type semiconductor material (N-type) channel.

12. The GAA FET device of claim 11, wherein the channel structure is under a tensile strain.

13. The GAA FET device of claim 1, wherein the channel comprises a P-type semiconductor material (P-type) channel.

14. The GAA FET device of claim 13, wherein the channel structure is under a compressive strain.

15. The GAA FET device of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

16. A method of fabricating a gate-all-around (GAA) field effect transistor (FET) device, comprising:
   forming a first electrode on a substrate;
   forming a second electrode on the substrate;
   forming a channel extending in a first direction between
      the first electrode and the second electrode, the channel
      having a first width in the first direction, the channel
      comprising one or more channel structures each having
      a first height in a second direction orthogonal to the first
      direction;
   forming a gate surrounding the channel, wherein the gate
      comprises one or more gate structures each having a
      third height in the second direction and each disposed
      adjacent to at least one channel structure of the one or
      more channel structures in the second direction;
   forming one or more inner spacers each adjacent to a gate
      structure of the one or more gate structures and each
      having a fourth height directly adjacent to the gate
      structure that is less than the third height; and
   forming one or more first extension regions each extend-
      ing from a channel structure of the one or more channel
      structures to the first electrode; and
      the one or more first extension regions each comprising
         one or more first enhanced extension portions each
            having a second height in the second direction
            greater than the first height.

17. The method of claim 16, wherein:
   forming the channel comprises:
      forming one or more semiconductor material layers
         each having the second height in the second direc-
         tion;
      etching at least a portion of the one or more semicon-
         ductor material layers to the first height to form the
         one or more channel structures each having the first
         height; and
   wherein the one or more extension regions comprise end
      portions of the one or more semiconductor layers
      having the second height in the second direction.

18. The method of claim 17, wherein a ratio of the second height to the first height is greater than 1.4.

19. The method of claim 17, wherein the first height is five (5) nanometers (nm) and the second height is eight (8) nm.

20. The method of claim 16, wherein forming the channel comprises:
   forming a plurality of semiconductor material layers each
      of the first height in the second direction; and
   forming a plurality of sacrificial layers interleaved with
      the plurality of semiconductor material layers each of a
      third height less than the first height in the second
      direction.

21. The method of claim 20, further comprising:

removing the plurality of sacrificial layers; and forming a gate structure of one or more gate structures of the gate between each channel structure of the one or more channel structures in the second direction.

22. The method of claim 16, further comprising:

doping first portions of the first electrode to form the one or more first extension regions.

23. The method of claim 16, further comprising:

forming one or more second extension regions each extending from a channel structure of the one or more channel structures to the second electrode; and the one or more second extension regions each having the first height.

24. The method of claim 16, further comprising:

forming one or more second extension regions each extending from a channel structure of the one or more channel structures to the second electrode; and the one or more second extension regions each comprising:

one or more second enhanced extension portions each having the second height in the second direction greater than the first height.

25. The method of claim 23, wherein each channel structure of the one or more channel structures, a first extension region of the one or more first extension regions between the channel structure and the first electrode, and a second extension region of the one or more second extension regions between the channel structure and the second electrode are a dumbbell-shaped structure.

26. A method of fabricating a gate-all-around (GAA) field effect transistor (FET) device, comprising:

forming a first electrode on a substrate;

forming a second electrode on the substrate;

forming a channel extending in a first direction between the first electrode and the second electrode, the channel having a first width in the first direction, the channel comprising one or more channel structures each having a first height in a second direction orthogonal to the first direction;

wherein forming the channel comprises:

forming a plurality of semiconductor material layers each of the first height in the second direction; and forming a plurality of sacrificial layers interleaved with the plurality of semiconductor material layers each of a third height less than the first height in the second direction;

removing the plurality of sacrificial layers;

forming a gate surrounding the channel, wherein forming the gate comprises forming a gate structure of one or more gate structures of the gate between each channel structure of the one or more channel structures in the second direction; and forming one or more first extension regions each extending from a channel structure of the one or more channel structures to the first electrode; and the one or more first extension regions each comprising one or more first enhanced extension portions each having a second height in the second direction greater than the first height.

* * * * *